United States Patent
He

(10) Patent No.: US 11,036,432 B2
(45) Date of Patent: Jun. 15, 2021

(54) LOW POWER MODE FOR A MEMORY DEVICE

(71) Applicant: Micron Technology, Inc., Boise, ID (US)

(72) Inventor: Yuan He, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/506,714

(22) Filed: Jul. 9, 2019

(65) Prior Publication Data

US 2021/0011655 A1 Jan. 14, 2021

(51) Int. Cl.
*G11C 7/10* (2006.01)
*G06F 3/06* (2006.01)
*G11C 7/22* (2006.01)
*G06F 13/16* (2006.01)

(52) U.S. Cl.
CPC .......... *G06F 3/0659* (2013.01); *G06F 3/0625* (2013.01); *G06F 3/0673* (2013.01); *G06F 13/1668* (2013.01); *G11C 7/22* (2013.01)

(58) Field of Classification Search
CPC .................................................. G11C 13/0069
USPC ..................................................... 365/189.09
See application file for complete search history.

(56) References Cited

U.S. PATENT DOCUMENTS

| 8,990,605 B2* | 3/2015 | Zitlaw | G11C 5/066 |
| | | | 713/400 |
| 2010/0030696 A1* | 2/2010 | Naccache | G06F 21/305 |
| | | | 705/71 |
| 2010/0103726 A1* | 4/2010 | Bae | G11C 5/145 |
| | | | 365/163 |
| 2013/0339775 A1* | 12/2013 | Shaeffer | G06F 1/04 |
| | | | 713/323 |
| 2018/0181344 A1* | 6/2018 | Tomishima | G11C 7/1015 |

* cited by examiner

*Primary Examiner* — Min Huang
(74) *Attorney, Agent, or Firm* — Holland & Hart LLP

(57) ABSTRACT

Methods, systems, and devices for low power mode for a memory device are described. A memory device may identify a pattern of data configured to be stored in an array of memory cells and determine if the pattern of data satisfies a criterion. The pattern of data may satisfy the criterion if each of the bits of data include a same logic value. If the pattern of data satisfies the criterion, the memory device may disable a driver of an internal bus of the memory device if the data satisfies the criterion, isolate a data line from the internal bus, or couple the data line with a voltage source, or a combination thereof. The memory device may further disable a signal of a clock tree based on identifying that the pattern of data satisfies the criterion.

24 Claims, 14 Drawing Sheets

LOW POWER MODE FOR A MEMORY DEVICE

BACKGROUND

The following relates generally to a system that includes at least one memory device and more specifically to low power mode for a memory device.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random-access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

Improving memory devices, generally, may include increasing memory cell density, increasing read/write speeds, increasing reliability, increasing data retention, reducing power consumption, or reducing manufacturing costs, among other metrics. Some memory cells may be configured to store multiple states. Improving a bandwidth (e.g., quantity of data accessed during a given duration) of a memory device may be desired.

DETAILED DESCRIPTION

A system may include a host device receiving sampled data reported by one or more sensors and communicating the sensor data to a memory device to be stored. In some cases, the sampled data from the sensors may remain relatively static over periods of time. For example, the data output by some internet of things (IoT) devices or sensors may remain relatively stable over time. In such cases, the system may adapt the operation of the memory device to conserve power at the memory device.

The host device may determine that its data being output has not changed and may therefore replace the sampled data (e.g., reported by a sensor) with a sequence of identical logic states (i.e., all logic '0' or all logic '1'). The host device may communicate this sequence of identical logic states to the memory device. The memory device may determine that the data includes the sequence of identical logic states and adapt the operation of the memory device accordingly. During the adapted operation of the memory device, the memory device may set a voltage of the internal bus (e.g., between the array of memory cells and the I/O interface) to a default or precharged voltage. Setting the internal bus to the default or precharged voltage may decrease a power consumption when compared to driving the voltage of the internal bus to represent the data from the host device. The memory device may further disable a clock signal associated with an I/O interface after the first bit (e.g., of the bit length). By toggling a data (DQ) clock tree one time for a data burst rather than multiple times, memory device may reduce the power consumed in storing the replaced data in the memory device.

Features of the disclosure are initially described in the context of a memory system as described with reference to FIG. 1. Features of the disclosure are described in the context of systems, data, timing diagrams, logic diagrams, and a process flow as described with reference to FIGS. 2-8. These and other features of the disclosure are further illustrated by and described with reference to an apparatus diagram and flowcharts that relate to low power mode for a memory device as described with references to FIGS. 9-12.

Figure 1:
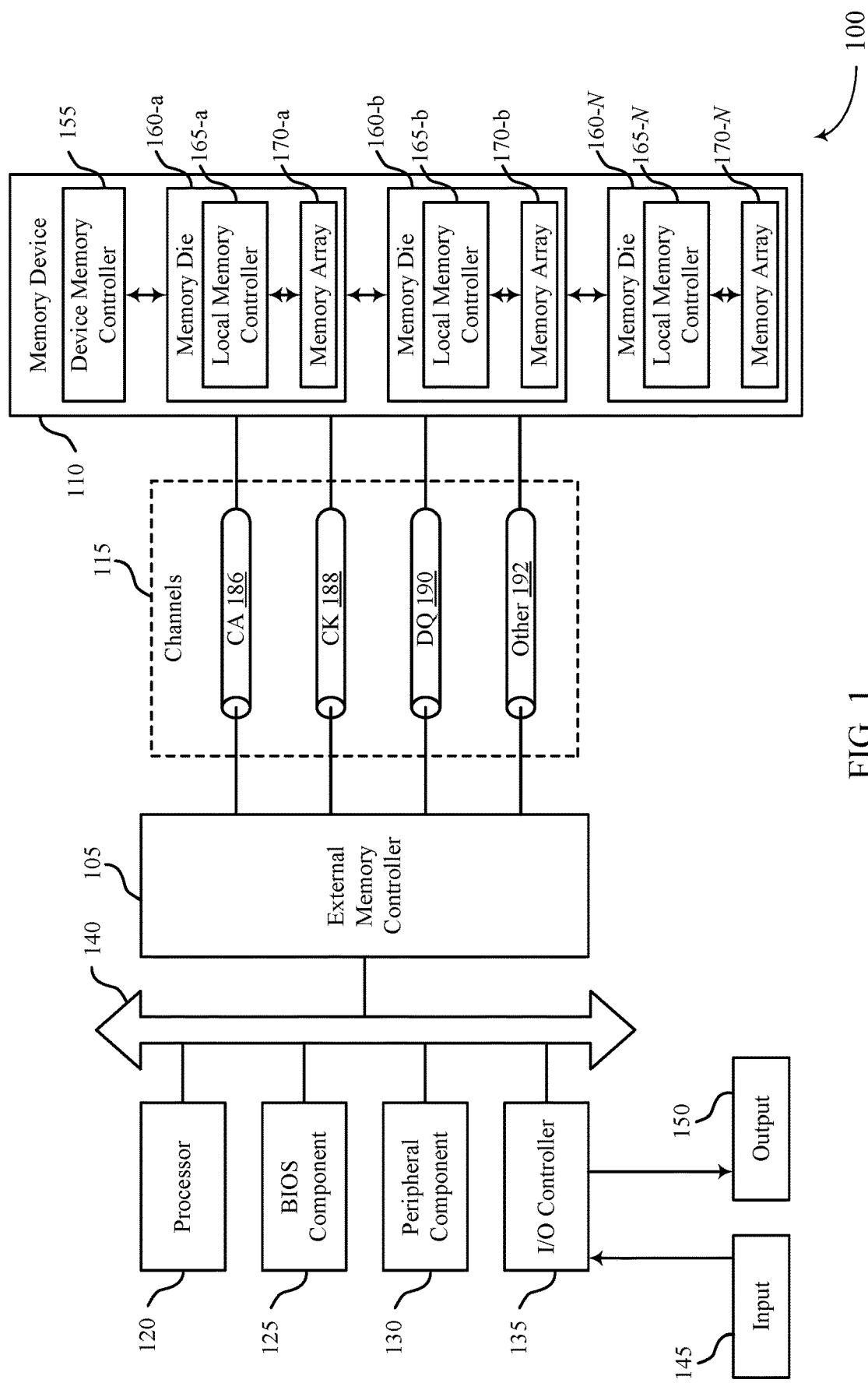
FIG. 1 illustrates an example of a system that supports a low power mode for a memory device in accordance with examples as disclosed herein.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100.

At least portions of the system 100 may be examples of a host device. Such a host device may be an example of a device that uses memory to execute processes such as a computing device, a mobile computing device, a wireless device, a graphics processing device, a router, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include sensors (e.g., included in an internet of things (IoT) system). The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The memory device 110 may include a device memory controller 155 and one or more memory dice 160. Each memory die 160 may include a local memory controller 165 (e.g., local memory controller 165-*a*, local memory controller 165-*b*, and/or local memory controller 165-N) and a memory array 170 (e.g., memory array 170-*a*, memory array 170-*b*, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The device memory controller 155 may include circuits or components configured to control operation of the memory device 110. In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

In some cases, the local memory controller 165 may determine to adapt a mode of operation of the memory die 160 based on receiving data (e.g., from the external memory controller 105) that satisfies a pattern. The pattern may dictate that each bit of the data includes a same logic value. During the adapted operation of the memory device, the local memory controller 165 may set a voltage of the internal bus (e.g., between a memory array 170 and the channels 115) to a default or precharged voltage. Setting the internal bus to the default or precharged voltage may decrease a power consumption when compared to driving the voltage of the internal bus to represent the data from the external memory controller 105. The local memory controller 165 may further disable a clock signal associated with an I/O interface after the first bit (e.g., of the bit length). By toggling the DQ clock tree one time for a data burst rather than multiple times, local memory controller 165 may reduce the power consumed in storing data at a memory array 170.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths). In some cases, the channels 115 may include one or more clock signal (CK) channels 188.

In some cases, the channels 115 may include one or more DQ channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Figure 2:
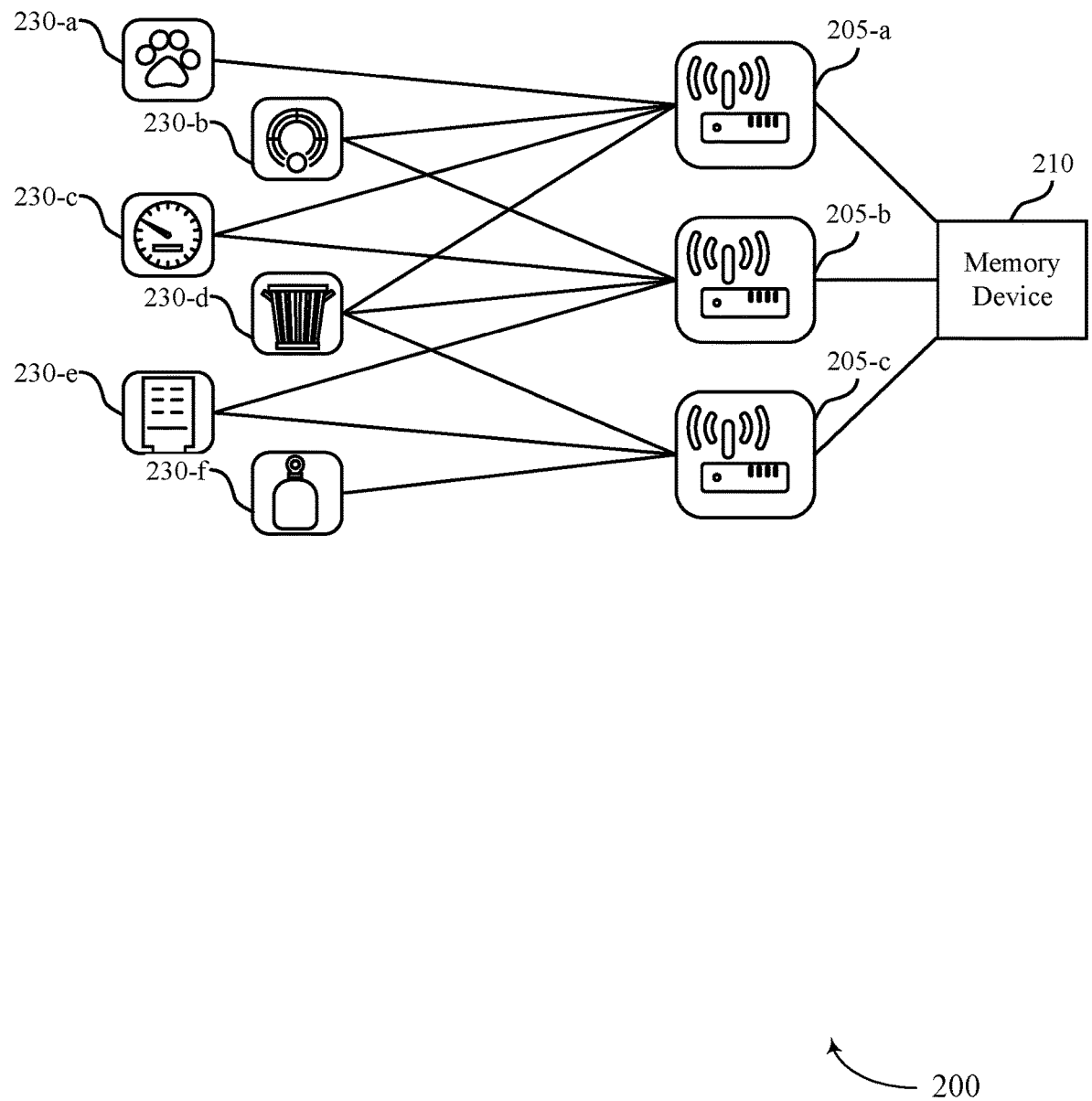
FIG. 2 illustrates an example of a system that supports a low power mode for a memory device in accordance with examples as disclosed herein.

FIG. 2 illustrates an example of a system 200 that supports low power mode for a memory device in accordance with examples as disclosed herein. System 200 may include one or more components described herein with reference to FIG. 1, among others. For example, the system 200 may include host device 205, which may be an example of the external memory controller 105 as described with reference to FIG. 1; a memory device 210, which may be an example of the memory device 110 or the memory dice 160 as described with reference to FIG. 1; and sensors 230, which may be examples of peripheral components 130 as described with reference to FIG. 1.

System 200 may include one or more sensors 230 for capturing data over time, or measuring data at regular intervals in a time series. For example, sensor 230-a may measure data associated with pet tracking, sensor 230-b may measure data associated with a smoke alarm, sensor 230-c may measure data associated with a water meter, sensor 230-d may measure data associated with a trash container, sensor 230-e may measure data associated with a vending machine, and sensor 230-f may measure data associated with gas monitoring. System 200 may include other sensors 230, such as sensors 230 that measure data associated with biometric monitoring, or other devices or activities. The one or more sensors 230 may sample the measured data and report the sampled data via a wired or wireless connection with a host device 205-a, host device 205-b, or host device 205-c.

The host devices 205 may communicate the sampled data with a memory device 210 for storage. The memory device 210 may receive the sampled data by an I/O interface according to a burst length. For example, the memory device 210 may use a burst length of eight (e.g., BL8) and receive eight bits serially from a host device 205. In some other cases, the memory device 210 may use burst lengths of other sizes (e.g., 16, 22, 64). The memory device may communicate the sampled data from the I/O interface to an array of memory cells for storage by an internal bus by adjusting the voltage on the internal bus according to the logic value of the sampled data. For example, the memory device 210 may apply a relatively low voltage to the internal bus to communicate a logic value of '0'. Additionally or alternatively, the memory device 210 may apply a relatively high voltage to the internal bus to communicate a logic value '1'. The memory device 210 may store the sampled data as a series of logic states.

In some cases, the sampled data reported by the one or more sensors 230 may remain relatively static over periods of time. For example, the sensor 230-b (e.g., measuring data associated with a smoke alarm) may consistently report to the host device 205-a that no smoke is detected. In some cases, when the sampled data reported by the sensors 230 does not change, the host devices 205 may continue to transfer the sampled data to the memory device 210. That is, the sampled data may be valuable at a future time, even if the value of the sampled data may not be known at the time the one or more sensors 230 capture the data. Storing sampled data in the memory device 210 may consume power. In some cases it may be desirable to decrease the power consumption of the system 200. That is, a power budget for an IoT system (e.g., system 200) may be relatively small.

In a case that the sampled data does not change over time, the host devices 205 may replace the sampled data with a sequence of identical logic states (i.e., all logic '0' or all logic '1'). For example, if the sensor 230-c may indicate a water level at a first time to the host device 205-a. The host device 205-a may communicate the sensor 230-c data to the memory device 210. At a second time (e.g., after the first time), the sensor 230-c may indicate the same water level to the host device 205-a. The host device 205-a may replace the sampled data reported by sensor 230-c with all logic value '0's or all logic value '1's. The sequence of identical logic states may indicate that the sampled data reported by the sensor 230-c remains unchanged. The host device 205-a may communicate the replaced data to the memory device 210.

The memory device 210 may determine that the data includes the sequence of identical logic states and adapt an operation of the memory device 210 accordingly. The adapted operation of the memory device 210 may decrease the power consumption of the memory device 210 based on determining that the sampled data (e.g., reported by a sensor 230) did not change over time. During the adapted operation of the memory device 210, the memory device 210 may set a voltage of the internal bus (e.g., between the array of memory cells and the I/O interface) to a default or pre-charged voltage. For example, the default voltage of the internal bus may be a virtual ground voltage. Additionally or alternatively, the default voltage of the internal bus may be a source supply voltage (Vss) associated with the memory device 210. Setting the internal bus to the default or pre-charged voltage may decrease a power consumption when compared to driving the voltage of the internal bus to represent data that varies from the host device 205. The memory device 210 may further disable a clock signal associated with an I/O interface after the first bit (e.g., of the bit length). For example, the memory device 210 may toggle an internal data I/O clock tree, which may be referred to as a DQ clock tree, at the first bit of the data burst, and disable the DQ clock tree for the subsequent bits of the data burst. By toggling the DQ clock tree one time for a data burst rather than multiple times, memory device 210 may reduce the power consumed in storing the replaced data in the memory device 210.

Figure 3A:
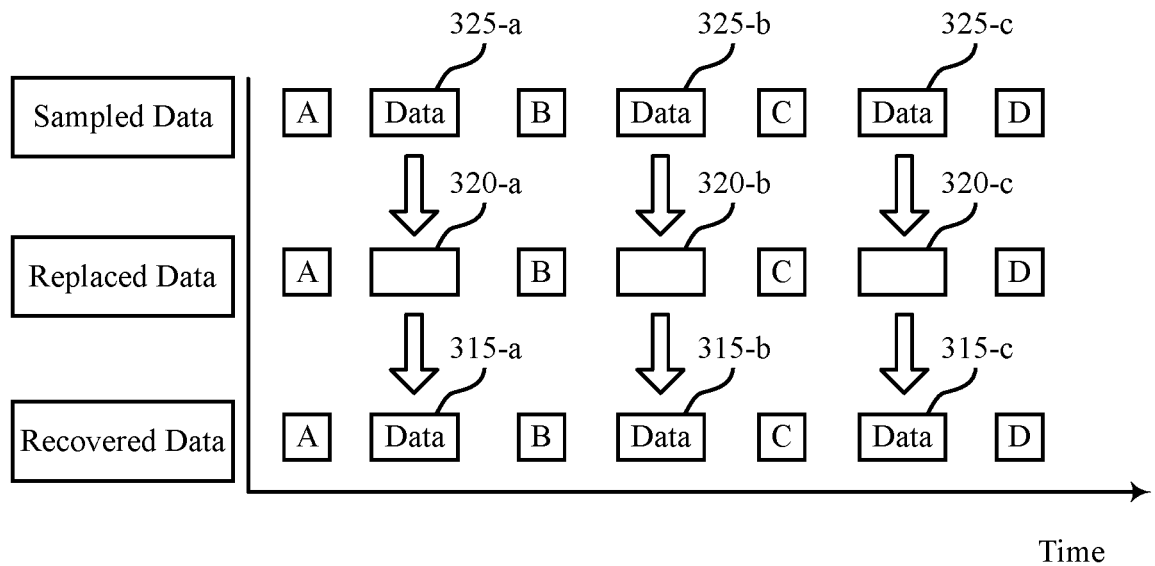
FIG. 3A illustrates examples of data that supports a low power mode for a memory device in accordance with examples as disclosed herein.
Figure 3B:
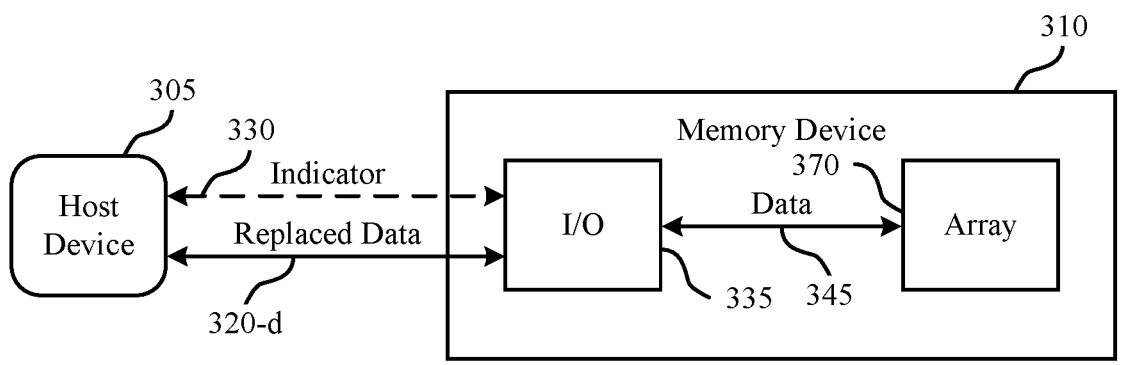
FIG. 3B illustrates an example of a system that supports a low power mode for a memory device in accordance with examples as disclosed herein.

FIGS. 3A and 3B illustrate examples of a data flow that supports a low power mode for a memory device. Specifically, FIG. 3A shows data flow 300 and FIG. 3B shows devices and a system communicating the data illustrated in FIG. 3A.

FIG. 3A illustrates an example of a data flow 300 that supports a low power mode for a memory device in accordance with examples as disclosed herein. Data flow 300 may include aspects described herein with reference to FIGS. 1 and 2. For example, the sampled data 325 may be reported by a sensor or peripheral device as described with reference to FIG. 1. The replaced data and the recovered data may be replaced or recovered by a host device or external memory controller as described with reference to FIG. 1.

A sensor may report sampled data 325 to a host device, such as an IoT SoC or the host device 305 described with reference to FIG. 3B. The sensor may report the sampled data 325-a between time A and time B, the sampled data 325-b between time B and time C, and the sampled data 325-c between time C and time D. The sampled data 325-a, the sampled data 325-b, and the sampled data 325-c may each have a length equal to a burst length for a memory device associated with a memory device (e.g., memory device 310 described with reference to FIG. 3B).

The host device may identify one or more criteria for replacing the sampled data 325. In some examples, the criteria may include a threshold, a configured variation limit, or another parameter associated with the sampled data 325, or a combination thereof. If the host device determines the sampled data 325 meets the one or more criteria, the host device may determine to replace the sampled data 325 with replaced data 320. The criteria may be based on the sampled data 325 remaining unchanged from a first time to a second time. That is, if the sampled data 325 meets the criteria, the sampled data 325 may be identical to the previous sampled data 325. For example, the host device may receive the sampled data 325-a between time A and time B. The host device may determine that the sampled data 325-a does not meet the criteria (e.g., the sampled data 325-a is different than sampled data 325 received prior to time A. Here, the replaced data 320-a may include the sampled data 325-a. The host device may receive sampled data 325-b between time B and time C and determine that the sampled data 325-b is the same as the sampled data 325-a. Here, the replaced data may contain a sequence of identical logic states (e.g., logic '0's, logic '1's) to represent no change during the burst length.

In some cases, the replaced data 320-a, the replaced data 320-b, and the replaced data 320-c may each contain a sequence of identical logic states to represent no change during the burst length. The host device may transfer the replaced data 320 to the memory device (e.g., associated with the IoT device) for storage. The host device may maintain an association between the replaced data 320 and the sampled data 325. If a user determines at a future time that the sampled data 325 is valuable and requests the data, the host device may generate recovered data 315 based on the replaced data 320, where the recovered data 315-a, the recovered data 315-b, and the recovered data 315-c are equivalent to the sampled data 325-a, the sampled data 325-b, and the sampled data 325-c, respectively.

FIG. 3B illustrates an example system 301 that supports a low power mode for a memory device in accordance with examples as disclosed herein. System 301 may include components described herein with reference to FIGS. 1 and 2. For example, the system 301 may include host device 305, which may be an example of the external memory controller or host device as described with reference to FIGS. 1 and 2 and a memory device 310, which may be an example of the memory devices or the memory dice as described with reference to FIGS. 1 and 2. The system 301 may further include aspects from the data flow 300 as described with reference to FIG. 3A. For example, the host device 305 may receive the sampled data and the recovered data (e.g., from sensors and a memory device, respectively), and the memory device 310 may receive the replaced data from the host device.

A host device 305, such as an IoT SoC, may receive sampled data from one or more sensors. Based on one or more criteria, the host device 305 may determine to replace the sampled data with replaced data 320-d. For example, the host device 305 may determine that the sampled data is the same as the previously-sampled data. Therefore, the host device 305 may replace the sampled data with the replaced data 320-d. The replaced data 320-d may contain burst lengths of data that each contain a sequence of identical logic states. The value of the identical logic states (e.g., a logic '0', a logic value '1') may be based on a low-power state of the system 301. For example, the low-power mode the on-die termination (ODT) of the system 301 may correspond to a logic value '0.' The host device 305 may communicate the replaced data 320-d to a memory device 310 for storage. Because the replaced data 320-d corresponds to the low-power mode of the system 301, communicating the replaced data 320-d may consume less power than communicating the sampled data to the memory device 310. In some cases, the system 301 may further conserve power when reading the replaced data 320-d from the memory device 310.

In some examples, the host device 305 may indicate that the replaced data 320-d contains a sequence of identical logic states by an indicator 330. The host device 305 may communicate the indicator 330 over an identifier pin associated with the memory device 310. In some examples, the identifier pin may include be a dedicated pin (e.g., for the indicator 330) coupled with the memory device 310. Here, the memory device 310 may include an additional pin for the indicator 330. In some other cases, the identifier pin of the memory device 310 may be used to communicate other information to between the memory device 310 and the host device 305.

The memory device 310 may include an I/O interface 335 and a memory array 370. The I/O interface may receive the replaced data 320-d from the host device 305. The I/O interface may communicate data 345 to the memory array 370. Bits of the data 345 may be set to a low-power logic state of an internal bus of the memory device 310 (e.g., from the I/O interface 335 to the memory array 370). In some examples, the data 345 may include the same logic state as the replaced data 320-d, or the data 345 may include the opposite logic state.

In some cases, the I/O interface 335 may determine that the replaced data 320-d contains a sequence of identical logic states. For example, the I/O interface 335 may receive an indicator 330 from the host device 305. In another example, the I/O interface 335 may receive an indicator generate at the memory device 310. Based on determining that the replaced data 320-d contains a sequence of identical logic states, the memory device 310 may adapt the operation of the memory device 310 to conserve power. During the adapted operation of the memory device 310, the memory device 310 may set a voltage of the internal bus to a default or precharged voltage. The memory device 310 may further disable a clock signal associated with the I/O interface 335 after the first bit (e.g., of the bit length).

Figure 4:
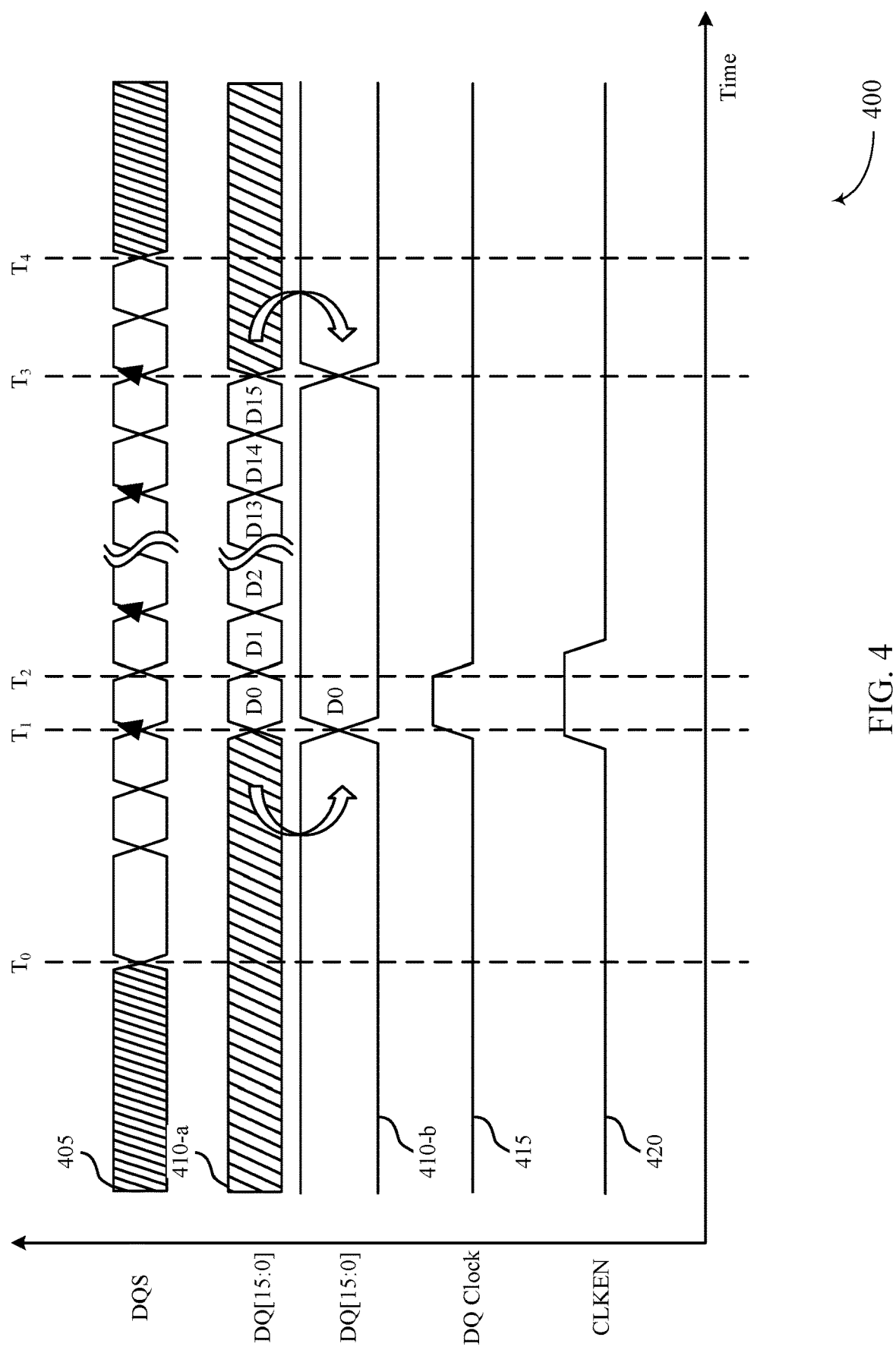
FIG. 4 illustrates a timing diagram that supports a low power mode for a memory device in accordance with examples as disclosed herein.

FIG. 4 illustrates an example of a timing diagram 400 that supports low power mode for a memory device in accordance with examples as disclosed herein. The timing diagram 400 may include aspects as described with reference to FIGS. 1 through 3. For example, the signals shown in the timing diagram 400 may correspond to signals generated by a memory device, which may be an example of the memory devices or the memory dice as described with reference to FIGS. 1 through 3.

The data strobe (DQS) clock 405 may represent a clock signal output from a memory device to a host device, such as an IoT SoC. The memory device may receive a write command indicating for the memory device to write data (e.g., 16 bits of data) from a DQ line 410 to an array of the memory device. Between $T_0$ and $T_1$, the DQS clock 405 may include a read preamble for a duration (e.g., a read preamble duration or TRPRE). The read preamble may provide a time period for the memory device to enable circuitry for receiving data from the host device. At $T_1$, the memory device may begin reading data received by the DQ line 410. Between $T_1$ and $T_2$, the memory device may receive a first bit D0 of a data burst from the host device. In some examples, the data burst (e.g., received by the DQ line 410-a) may include 16 bits of data received between time $T_1$ and $T_3$. Here, the memory device may determine a voltage level on the DQ line 410-*a* at times associated with each bit of data (e.g., D0, D1, D15) to determine logic values associated with each of the bits of data. In some other cases, the memory device may determine that the data burst contains a sequence of identical logic states. Here, the data burst may only include the first bit D0 of the data burst. That is, the DQ line 410-*b* may be driven to a voltage level indicative of the logic value of the first bit D0 of the data burst. For the remainder of the data burst (e.g., from time $T_1$ to time $T_2$), the memory device may continue to drive the DQ line 410-*b* according to the same voltage level. In some cases, the memory device may determine a voltage level on the DQ line 410-*b* at times associated with sixteen bits of data (e.g., D0, D1, D15) to determine logic values associated with each of the bits of data. However, the memory device may determine a same voltage level (e.g., associated with the first bit D0 of data).

The memory device may continue to drive the DQ line 410-*b* due to a disabling of the DQ clock 415. For example, the memory device may adjust the voltage level of the DQ line 410 according to the DQ clock 415. For example, the memory device may adjust the voltage level of the DQ line 410 at a rising edge of the DQ clock 415. The memory device may determine that the data burst contains a sequence of identical logic states. As a result, the memory device may disable the DQ clock 415. For example, the memory device may drive the clock enable (CLKEN) signal 420 high at time $T_1$ based on determining that the data burst contains a sequence of identical logic states. The CLKEN signal 420 may disable the DQ clock 415 after time $T_2$, thus preventing the DQ clock signal from continuing for the data burst.

After the data burst is received, the DQS clock 405 may include a read postamble between $T_3$ and $T_4$ for a duration (e.g., a read preamble duration or TRPST). The read postamble may provide a separation between write commands from different host devices. In some examples, consecutive write commands from the same host device may not be separated by a read postamble.

Figure 5A:
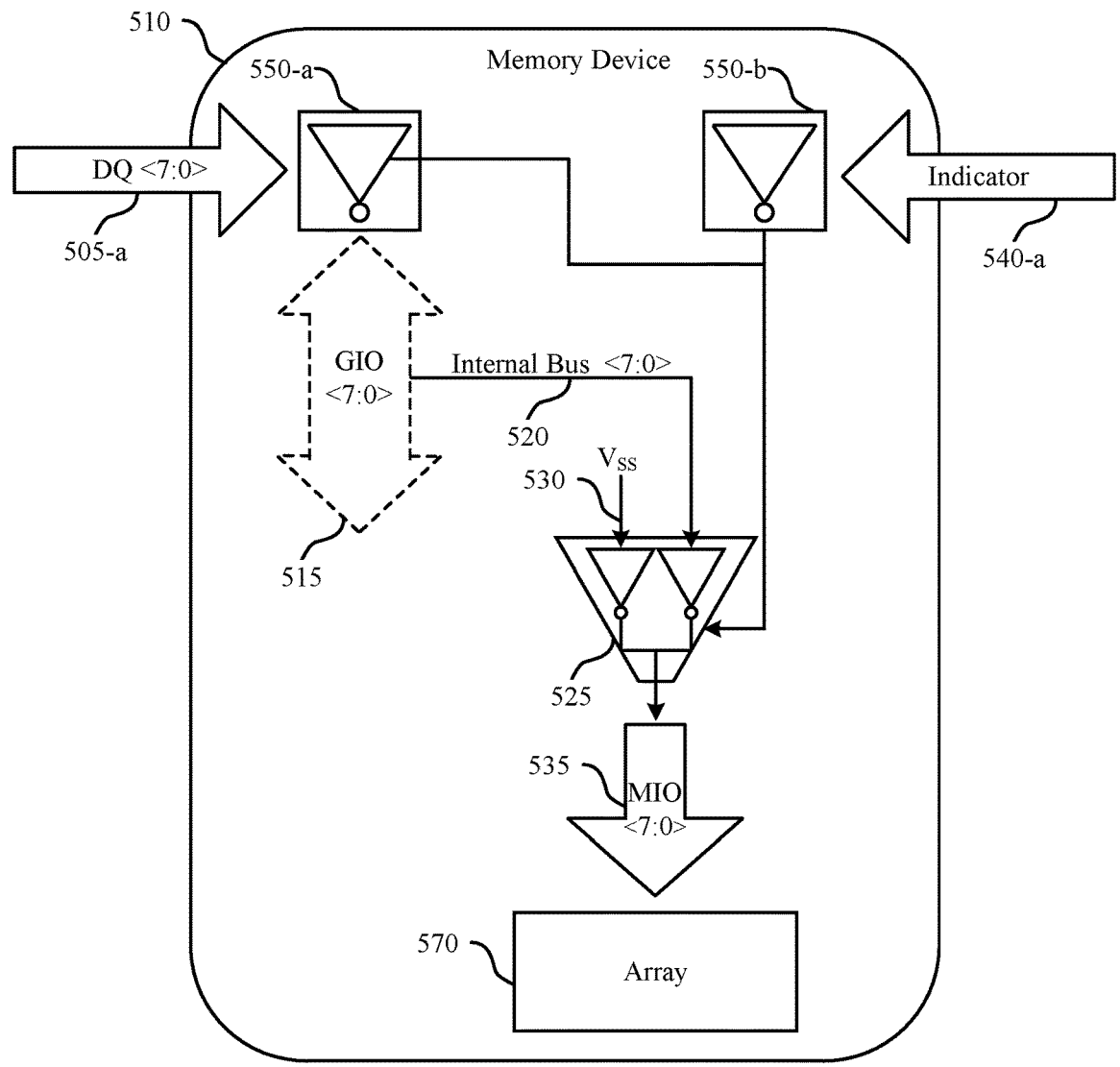
FIGS. 5A and 5B illustrate an example system and circuitry that support a low power mode for a memory device in accordance with examples as disclosed herein.
Figure 5B:
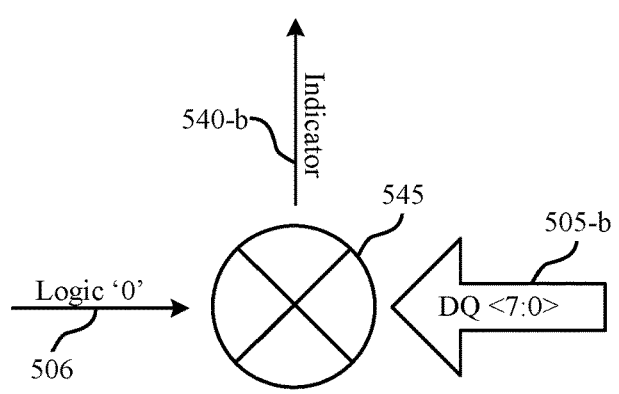

FIGS. 5A and 5B illustrate examples of a memory device and circuitry at the memory device that support a low power mode for a memory device in accordance with examples as disclosed herein. In particular, FIG. 5A shows a memory device and FIG. 5B shows circuitry that may enable the memory device (e.g., shown in FIG. 5A) to support a low power mode.

FIG. 5A illustrates an example of a system 500 that supports low power mode for a memory device in accordance with examples as disclosed herein. The system 500 may include aspects as described with reference to FIGS. 1 through 4. For example, the system may include a memory device 510, which may be an example of the memory devices or the memory dice as described with reference to FIGS. 1 through 3.

The memory device 510 may receive data 505-*a* from a host device such as an IoT SoC. The data 505-*a* may contain sampled data reported by one or more sensors, or may contain replaced data including a sequence of identical logic states to indicate no change in the one or more sensors. The data 505-*a* may be received at a global input/output (GIO) bus 515 driven by driver 550-*a*. In some cases, the driver 550-*a* and the GIO bus 515 may be referred to as an I/O interface. The GIO bus 515 may transfer a signal representing the data 505-*a* via an internal bus 520 to a multiplexer 525.

The indicator 540-*a* may indicate that the data 505-*a* satisfies one or more criteria (e.g., each bit of the data 505-*a* is a same logic value). The indicator 540-*a* may be bits of a same logic value to indicate that the data 505-*a* satisfies one or more criteria, where the logic value aligns with an on-die termination state. For example, the indicator 540-*a* may include bits each of logic value '0' or bits each of logic value '1.' The indicator 540-*a* may be received from the host device or generated by the memory device 510. The memory device 510 may receive the indicator from the host device by an identifier pin coupled to the multiplexer 525. Additional details regarding generating the indicator at the memory device 510 may be discussed with reference to FIG. 5B. The indicator 540-*a* may be communicated to the driver 550-*a* associated with the GIO bus 515. In some cases, if the indicator 540-*a* indicates that the data 505-*a* contains a sequence of identical logic states, the memory device 510 may disable the driver 550-*a*. This may decrease a power consumption of the memory device 510 in an event that the data 505-*a* contains a sequence of identical logic states. In some cases, the indicator 540-*a* may be communicated with the host device. The host device may also disable a buffer for the data 505-*a*. Thus, the host device may also decrease a power consumption of the system 500-*a*.

The multiplexer 525 may receive the signal from the internal bus 520, as well as the indicator 540-*a* (e.g., from the identifier pin). The multiplexer 525 may be coupled with a multifunction input/output (MIO) data line 535, which may in turn be coupled with a memory array 570. Based on the indicator 540-*a*, the multiplexer 525 may couple the MIO data line 535 with either the internal bus 520 or a voltage source 530, which may be referred to as Vss. If the MIO data line 535 is coupled with the internal bus 520, the data 505-*a* may be written to the memory array 570, which may toggle the MIO data line 535 for each bit of the data 505-*a*. Alternatively, if the MIO data line 535 is coupled with the voltage source 530, the voltage source 530 may cause bits containing a single logic state to be written to the memory array 570, where the logic state may be a low-power logic state of the memory array 570. For example, if the memory device 510 is a DRAM memory device, the low-power logic state may be a logic '1'. The multiplexer 525 may propagate the signal generated by the voltage source 530 to the MIO data line 535 which may reduce the power consumed by the memory device 510 during the write operation. In some cases, Vss may be set to align with a single MIO 535 equalization state.

During a read operation, the memory device 510 may retrieve the data 505-*a* from the array 570 and communicate the data 505-*a* from the memory device 510 to a host device. Here, the memory device 510 may employ techniques to decrease a power consumption of the system 500 during the read operation. For example, the memory device 510 may determine (e.g., based on an indicator similar to indicator 540-*a*) that the data 505-*a* satisfies one or more criteria. As a result, the multiplexer 525 may couple the MIO data line 535 to the voltage source 530. Further, the memory device 510 may disable the driver 550-*a* for the GIO bus 515. In some cases, the host device may disable the buffer for the data 505-*a* during the read operation. As a result, the power consumption during the read operation associated with data that satisfies one or more criteria may be less than a read operation associated with data that does not satisfy the one or more criteria.

FIG. 5B illustrates an example of circuitry 501 that supports low power mode for a memory device in accordance with examples as disclosed herein. The circuitry may be contained at the memory device 510-*a* as described with reference to FIG. 5A. Additionally or alternatively, a host device (e.g., as described with reference to FIGS. 1 through 4) may include the circuitry 501.

The circuitry 501 may determine if data (e.g., data 505-*b*) satisfies one or more criteria. For example, the circuitry 501 may determine if each bit of the data 505-*b* is a same logic value. The circuitry 501 may be referred to as pattern identification logic. That is, the circuitry 501 may identify whether data 505-*b* satisfies a pattern of including a single logic value.

A host device or a memory device may include a logic gate 545 (e.g., an exclusive OR (XOR) logic gate) that outputs an indicator 540-*b*. In some examples, the indicator 540-*b* may be an example of the indicator 540-*a* described with reference to FIG. 5A. The logic gate 545 may receive a data burst 505-*b* and a logic '0' data burst 506. The data burst 505-*b* may include sampled data reported by a sensor. The circuitry 501 may compare the data burst 505-*b* to the logic '0' data burst 506 using the logic gate 545 and generate the indicator 540-*b* based on the comparison. For example, if the data burst 505-*b* indicates no change in the sensor (e.g., contains only logic '0's), the logic gate 545 may output an indicator 540-*b* indicating that the data 505-*b* satisfies the criterion. Alternatively, if the data burst 505-*b* includes sensor data (e.g., various logic values), the logic gate 545 may output an indicator 540-*b* indicating that the data 505-*b* does not satisfy the criterion. In some examples, a host device may send the indicator 540-*b* to an identifier pin of a memory device, or the identifier pin may send the indicator 540-*b* to disable a GIO bus.

Figure 6A:
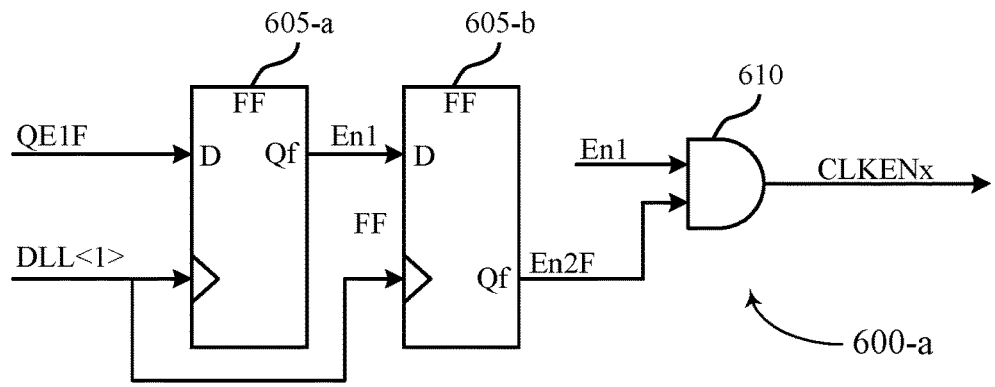
FIGS. 6A and 6B illustrate example logic diagrams that support a low power mode for a memory device in accordance with examples as disclosed herein.
Figure 6B:
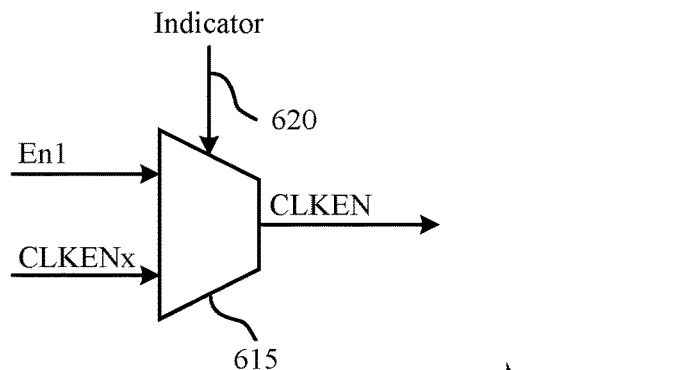
Figure 6C:
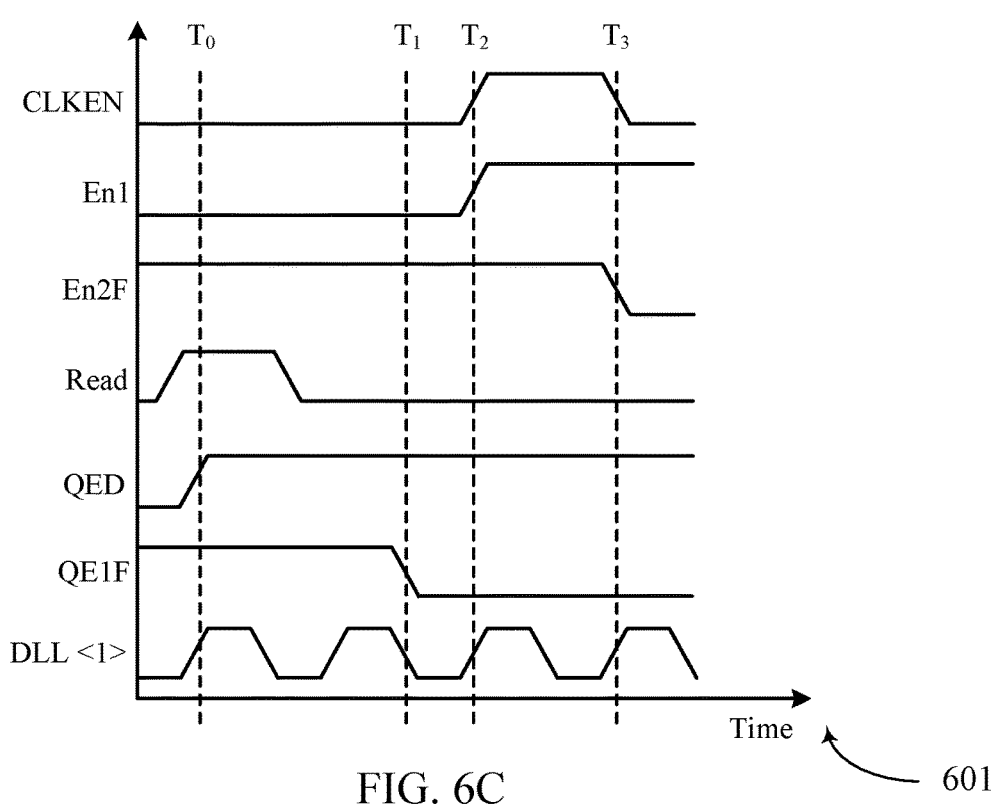
FIG. 6C illustrates an example timing diagram that supports a low power mode for a memory device in accordance with examples as disclosed herein.

FIGS. 6A-6C illustrate diagrams of logic and an associated timing diagram. Specifically, FIG. 6A illustrates logic to generate a clock enable signal, CLKENx and FIG. 6B illustrates logic to generate a second clock enable signal, CLKEN. FIG. 6C illustrates a timing diagram showing a relationship between the second clock enable signal, CLKEN, and other signals involved in generating the CLKEN signal.

FIG. 6A illustrates an example of a logic diagram 600-*a* that supports low power mode for a memory device in accordance with examples as disclosed herein. Logic diagram 600-*a* may illustrate logic components and signals associated with a memory device as described with reference to FIGS. 1 through 5.

A QE1F signal may output a low voltage in response to an access command (e.g., a read command) being received at a memory device. The QE1F signal may be input into a flip-flop 605-*a*, with a delay lock loop (DLL)<1> signal as a clock signal for the flip-flop 605-*a*. The DLL <1> signal may be a clock signal associated with the memory device that oscillates between a high voltage and a low voltage at a clock rate of the memory device in phase with a DQS clock of the memory device, such as the DQS clock 405 as described with reference to FIG. 4. The DLL <1> signal may be generated internally at the memory device to lock with an external clock (e.g., to ensure that output data such as DQ, DQX align with a controller strobe timing). In some cases, DLL <1> may be 180° out of phase with the external clock. The complementary output signal of the flip-flop 605-*a* may be referred to as an En1 signal, and may be input into a flip-flop 605-*b*, with the DLL <1> signal again used as a clock signal for the flip-flop 605-*b*. The output signal of the flip-flop 605-*b* may be referred to as an EnF2 signal. The EnF2 signal and a complement of the En1 signal (an EnF1 signal) may be inputs of a logic gate 610 (e.g., an AND logic gate). The output of the logic gate 610 may be a CLKENx signal. If the En1 and the En2F signal are both high, the CLKENx signal may be high. Otherwise, the CLKENx signal may be low.

FIG. 6B illustrates an example of a logic diagram 600-*b* that supports low power mode for a memory device in accordance with examples as disclosed herein. Logic diagram 600-*b* may illustrate logic components and signals associated with a memory device as described with reference to FIGS. 1 through 5. Further, logic diagram 600-*b* may include a signal, CLKENx generated by the logic diagram 600-*a* illustrated in FIG. 6A.

The CLKENx signal and the En1 signal described with reference to FIG. 6A may be input into a multiplexer 615 whose output is a clock enable signal, which may be referred to as a CLKEN signal. The CLKEN signal may be equivalent to the En1 signal or the CLKENx signal based on the presence of an indicator 620. The indicator 620 may be an example of the indicator 540-*a* or the indicator 540-*b* described with reference to FIG. 5. In some examples, the CLKEN signal may be equivalent to the En1 signal by default, and the indicator 620 may select the CLKEN signal to be equivalent to the CLKENx signal.

FIG. 6C illustrates an example of a timing diagram 601 that supports low power mode for a memory device in accordance with examples as disclosed herein. The timing diagram may be based on the logic diagrams 600-*a* and 600-*b* described with reference to FIGS. 6A and 6B.

A read command may be received (e.g., the read signal may be driven high). The read command may toggle the QED to high at $T_0$. At time $T_1$, the QE1F signal may toggle to low. Time $T_1$ may occur one cycle shift (e.g., a full cycle of DLL<1>) after the QED is toggled to high (e.g., at time $T_0$). The CLKEN signal may be high between $T_2$ and $T_3$, which may correspond to a duration of a data burst after a first bit of the data burst. The CLKEN signal may stop an internal clock of the memory device of between $T_2$ and $T_3$ in order to reduce the power consumed by the memory device during an access operation (e.g., in an event that each bit of the data includes a same logic value). Based on the indicator 620, the multiplexer may select the CLKENx signal to output as the CLKEN signal.

Figure 7:
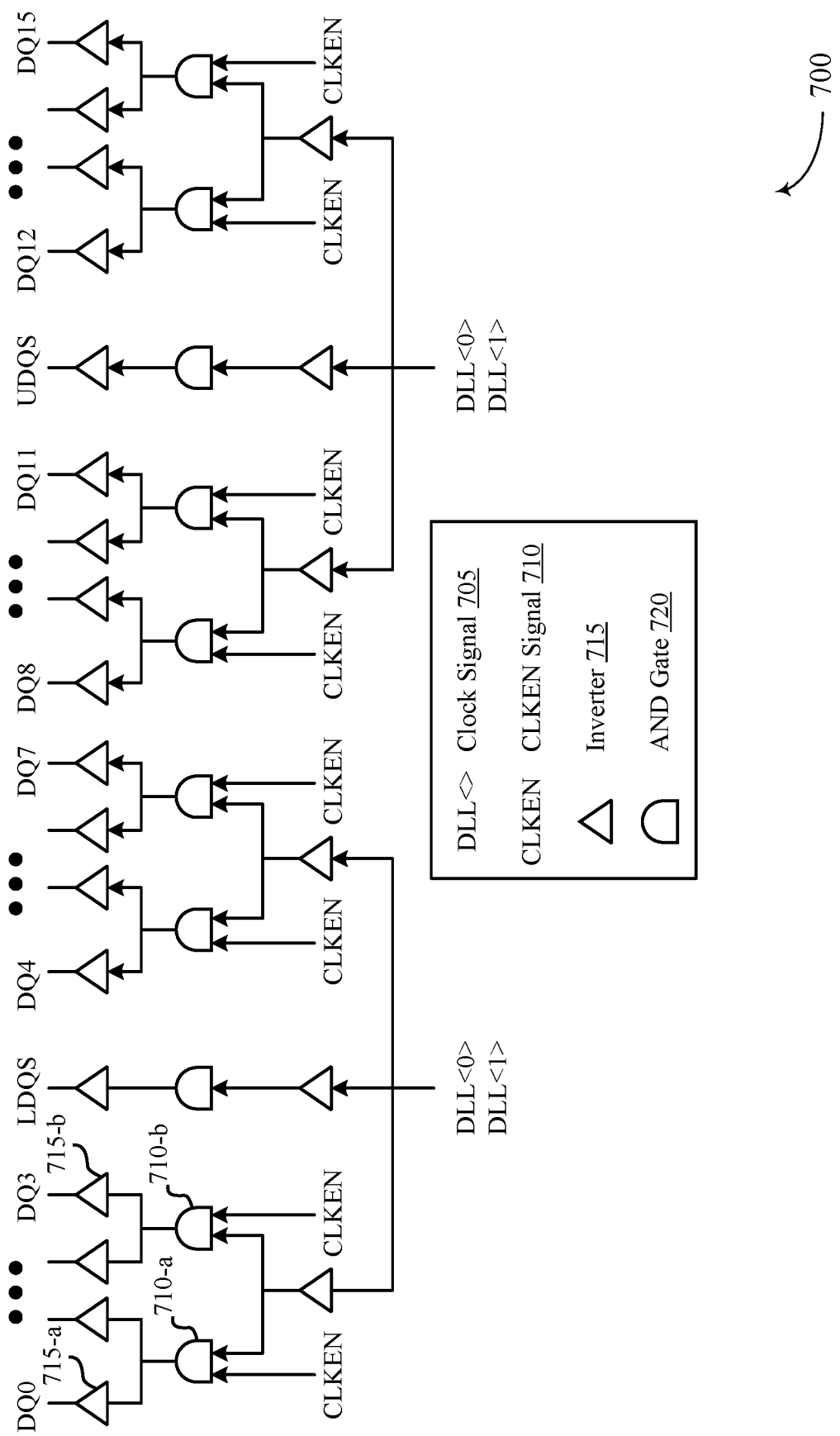
FIG. 7 illustrates an example of a logic diagram that supports low power mode for a memory device in accordance with examples as disclosed herein.

FIG. 7 illustrates an example of a logic diagram 700 that supports low power mode for a memory device in accordance with examples as disclosed herein. Logic diagram 700 may illustrate logic components and signals associated with a memory device as described with reference to FIGS. 1 through 5. Logic diagram 700 (e.g., a clock tree diagram) may include a clock signal 705, a CLKEN signal 710, a number of inverters 715, a number of AND gates 720, and a number of DQ outputs labeled as DQ0, DQ1, DQ2, up to DQ 16. The CLKEN signal 710 may be an example of the CLKEN signal 420 described with reference to FIG. 4, or the CLKEN signal described with reference to FIG. 6. The DQ outputs may represent a state of a DQ clock 415 as described with reference to FIG. 4 at a time corresponding to a bit of a 16-bit data burst. The clock signal 705 may a DLL<0> or <1> as described with reference to FIG. 6. As described with reference to FIGS. 4 and 6, the CLKEN signal may be a low state for the first bit of the data burst, and a high state for the remainder of the data burst.

As an example, the DQ0 output may be determined as follows: The clock signal 705 may be inverted before being input into an AND gate 720-*a*. At the first bit of the data burst, the CLKEN signal may be in a low state, and so the output of the AND gate 720-*a* is low for the first bit. The output may then be inverted by the inverter 715-*a*, and so the DQ0 output is high, triggering the DQ clock for the first bit of the data burst.

As an example of the remaining DQ outputs, the DQ3 output may be determined as follows: The clock signal 705 may be inverted before being input into an AND gate 720-*b*. At the third bit of the data burst (or any bit after the first bit), the CLKEN signal may be in a high state, and so the output of the AND gate 720-*b* is high for the third bit. The high output may then be inverted by the inverter 715-*b*, and so the DQ3 output is low, disabling the DQ clock for the third bit of the data burst.

Figure 8:
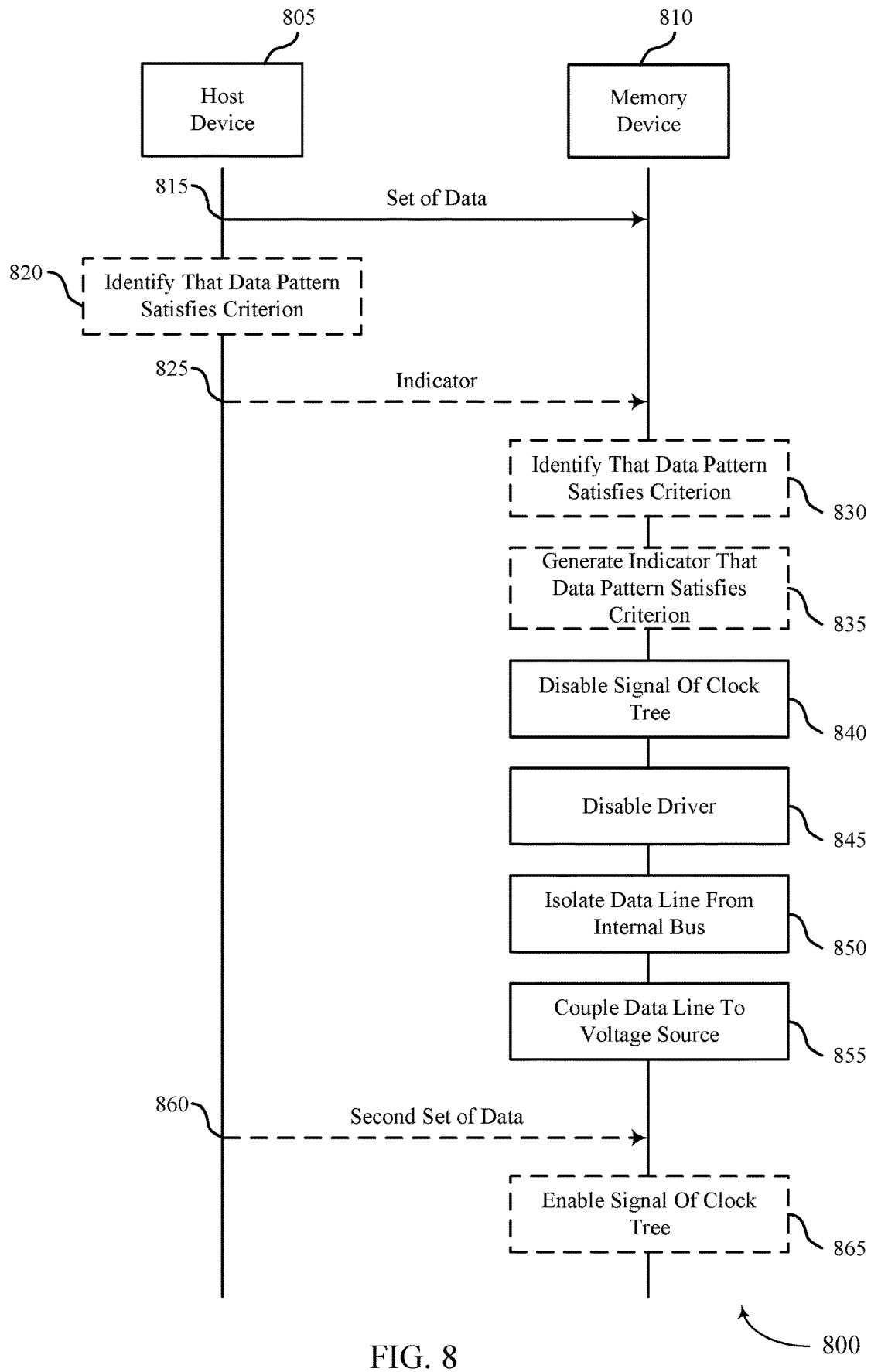
FIG. 8 illustrates an example of a process flow that supports low power mode for a memory device in accordance with examples as disclosed herein.

FIG. 8 illustrates an example of a process flow 800 that supports low power mode for a memory device in accordance with examples as disclosed herein. The process flow 800 may implement aspects as described with reference to FIGS. 1 through 7. The process flow 800 may include operations performed by a host device 805, which may be an example of the external memory controller 105 as described with reference to FIG. 1 or a host device 205 as described with reference to FIG. 2. The process flow 800 may further include operations performed by a memory device 810, which may be an example of the memory device 110, the memory array 170, the memory device 210, the memory device 310, or the memory device 510 as described with reference to FIGS. 1 through 3 and 4.

At 815, the host device 805 may transmit a set of data to the memory device 810 over a channel (e.g., a DQ channel). The set of data may correspond to data captured by a sensor. The memory device 810 may be configured to store the set of data in an array of memory cells of the memory device 810.

At 820, the host device 805 may optionally identify that the set of data includes a pattern of data that satisfies a criterion. The criterion may be based on each of the bits of the set of data including the same logic value. For example, if each bit of the set of data includes a same logic value (e.g., all logic value '0' or '1'), the set of data may satisfy the criterion. Additionally or alternatively, if each bit of the set of data does not include the same logic, the set of data may not satisfy the criterion. The host device 805 may determine to send an indicator that the set of data includes the pattern of data that satisfies the criterion (e.g., at 825).

At 825, the host device 805 may optionally transmit an indicator to the memory device 810. The indicator may be an indicator that the data associated with the host device 805 includes the pattern of data that satisfies the criterion.

At 830, the memory device 810 may optionally identify that the data pattern satisfies the criterion. The memory device 810 may identify that the data pattern satisfies the criterion based on receiving the indicator from the host device (e.g., at 825).

At 835, the memory device 810 may optionally generate an indicator that the pattern of data satisfies the criterion based on identifying the pattern of data. In some cases, the memory device 810 may generate an indicator that the pattern of data satisfies the criterion if the host device 805 does not transmit an indicator to the memory device 810 (e.g., at 825).

At 840, the memory device 810 may disable a signal of a clock tree at the memory device 810 based on identifying that the pattern of data satisfies the criterion. In some cases, the memory device 810 may disable the signal of the clock tree based on generating the indicator (e.g., at 835).

At 845, the memory device 810 may disable a driver of an internal bus of the memory device 810. The memory device 810 may disable the driver based on identifying that the pattern of data satisfies the criterion. In some cases, the memory device 810 may enable the driver of the internal bus of the memory device 810 after a quantity of cycles of a clock signal. For example, the memory device 810 may enable the driver of the internal bus of the memory device 810 after storing the set of data at the array of memory cells.

At 850, the memory device 810 may isolate a data line from the internal bus of the memory device 810 based on identifying that the pattern of data satisfies the criterion.

At 855, the memory device 810 may couple the data line with a voltage source based on isolating the data line.

At 860, the host device 805 may transmit a second set of data (e.g., different than the first set of data received at 815) to the memory device 810. The second set of data may fail to satisfy the criterion. That is, the second set of data may include more than a single logic value.

At 865, the memory device 810 may enable a signal of the clock tree at the memory device 810 based on receiving the second set of data. In some cases, the memory device 810 may enable (or continue to enable) the driver of the internal bus of the memory device based on the second set of data failing to satisfy the criterion. The memory device 810 may further couple the array of memory cells to the internal bus based on the second set of data failing to satisfy the criterion.

Figure 9:
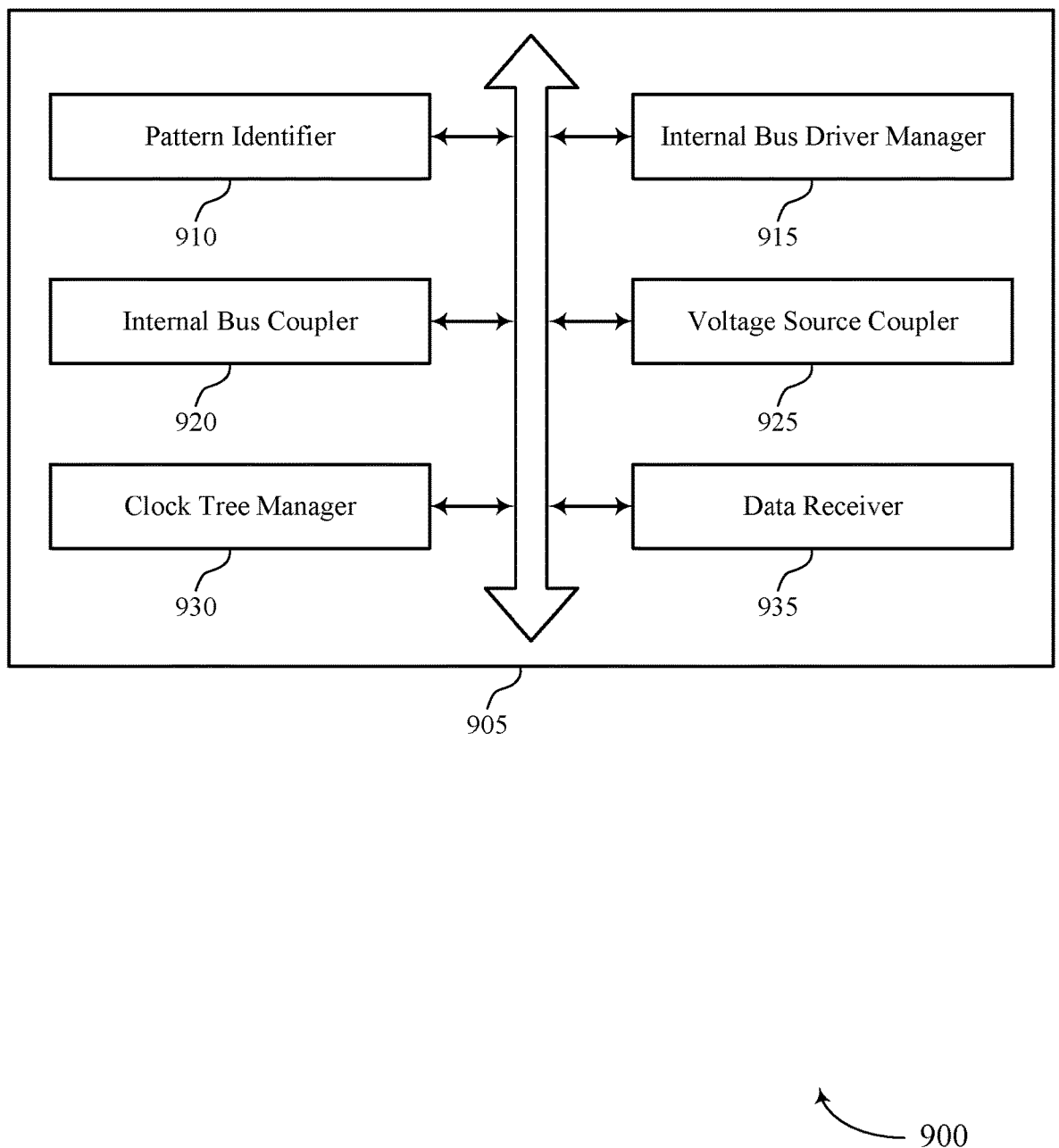
FIG. 9 shows a block diagram of a memory device that supports low power mode for a memory device in accordance with examples as disclosed herein.

FIG. 9 shows a block diagram 900 of a memory device 905 that supports low power mode for a memory device in accordance with examples as disclosed herein. The memory device 905 may be an example of aspects of a memory device as described with reference to FIGS. 1-3, 5, and 8. The memory device 905 may include a pattern identifier 910, an internal bus driver manager 915, an internal bus coupler 920, a voltage source coupler 925, a clock tree manager 930, and a data receiver 935. Each of these modules may communicate, directly or indirectly, with one another (e.g., via one or more buses).

The pattern identifier 910 may identify that a pattern of data configured to be stored in an array of memory cells of a memory device satisfies a criterion. In some examples, the pattern identifier 910 may generate an indicator that the pattern of data satisfies the criterion based on identifying the pattern of data, where disabling the driver is based on generating the indicator. In some instances, the memory device 905 may receive, from a host device, an indicator that data associated with the host device includes the pattern of data that satisfies the criterion. Here, identifying the pattern of data is based on receiving the indicator. In some examples, the pattern identifier 910 may determine that bits within the data include a same logic value, where identifying that the pattern of data satisfies the criterion is based on the determining that the bits within the data include the same logic value.

The internal bus driver manager 915 may disable a driver of an internal bus of the memory device based on identifying that the pattern of data satisfies the criterion. In some examples, the internal bus driver manager 915 may enable the driver of the internal bus of the memory device after a quantity of cycles of a clock signal.

The internal bus coupler 920 may isolate a data line of the array of memory cells from the internal bus of the memory device based on identifying that the pattern of data satisfies the criterion.

The voltage source coupler 925 may couple the data line of the array of memory cells with a voltage source based on isolating the data line.

The clock tree manager 930 may disable a signal of a clock tree at the memory device based on identifying that the pattern of data satisfies the criterion. In some examples, the clock tree manager 930 may enable the signal of the clock tree at the memory device based on receiving the second set of data different than the data.

The data receiver 935 may receive, from a host device, a second set of data corresponding to a second pattern that fails to satisfy the criterion. In some examples, the data receiver 935 may receive, from a host device, the data over a channel.

Figure 10:
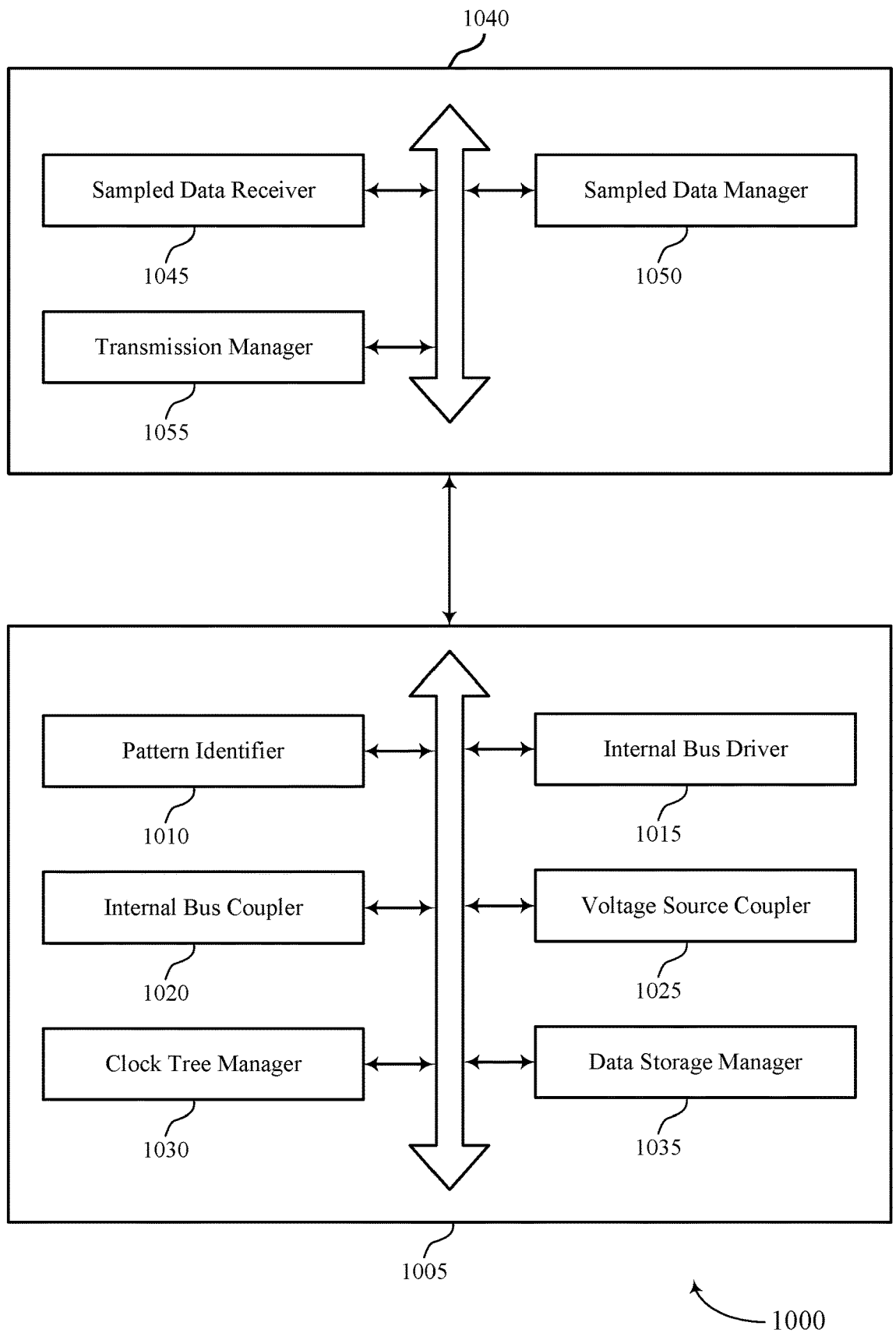
FIG. 10 shows a block diagram of a system that supports low power mode for a memory device in accordance with examples as disclosed herein.

FIG. 10 shows a block diagram 1000 of a system including a memory device 1005 and a host device 1040 that supports low power mode for a memory device in accordance with examples as disclosed herein. The memory device 1005 may be an example of aspects of a memory device as described with reference to FIGS. 1-3, 5, 8, and 9. The memory device 1005 may include components similar to those described with reference to FIG. 9. For example, the memory device 1005 may include a pattern identifier 1010, an internal bus driver 1015, and internal bus coupler 1020, a voltage source coupler 1025, a clock tree manager 1030, and a data storage manager 1035. The host device 1040 may be an example of aspects of a host device or external memory controller as described with reference to FIGS. 1-3, and 8. The host device 1040 may include a sampled data receiver 1045, a sampled data manager 1050, and a transmission manager 1055. Each of the modules (e.g., of the memory device 1005 and the host device 1040) may communicate, directly or indirectly, with one another (e.g., via one or more buses). The memory device 1005 and the host device 1040 may be in communication with each other within the system.

The sampled data receiver 1045 may receive first data sampled by a sensor. The sampled data receiver 1045 may replace the first data with second data. In some examples, the sampled data receiver 1045 may determine that the first data is the same as third data previously sampled by the sensor, where replacing the first data with the second data is based on the determining.

The transmission manager 1055 may transmit the second data from the host device 1040 to a memory device 1005. In some examples, the transmission manager 1055 may transmit an indicator from the host device 1040 to the memory device 1005 based on the transmitting the second data, where the indicator indicates that the pattern of the second data satisfies the criterion.

The pattern identifier 1010 may determine that a pattern of the second data satisfies a criterion. In some examples, bits within the second data include a same logic value, where the pattern of the second data satisfies the criterion based on the bits within the second data including the same logic value.

The internal bus driver 1015 may disable a driver of an internal bus of the memory device 1005 based on the determining that the pattern of the second data satisfies the criterion.

The data storage manager 1035 may store third data at an array of memory cells of the memory device 1005 based on the disabling the driver of the internal bus of the memory device 1005, where the third data is based on the second data and a pattern of the third data satisfies the criterion.

The internal bus coupler 1020 may isolate a data line of the array of memory cells from the internal bus of the memory device 1005 based on the determining that the pattern of the second data satisfies the criterion.

The voltage source coupler 1025 may couple the data line of the array of memory cells with a voltage source based on isolating the data line, where storing the third data at the array of memory cells is based on the coupling the data line of the array of memory cells with the voltage source.

The clock tree manager 1030 may disable a signal of a clock tree at the memory device 1005 based on the determining that the pattern of the second data satisfies the criterion.

Figure 11:
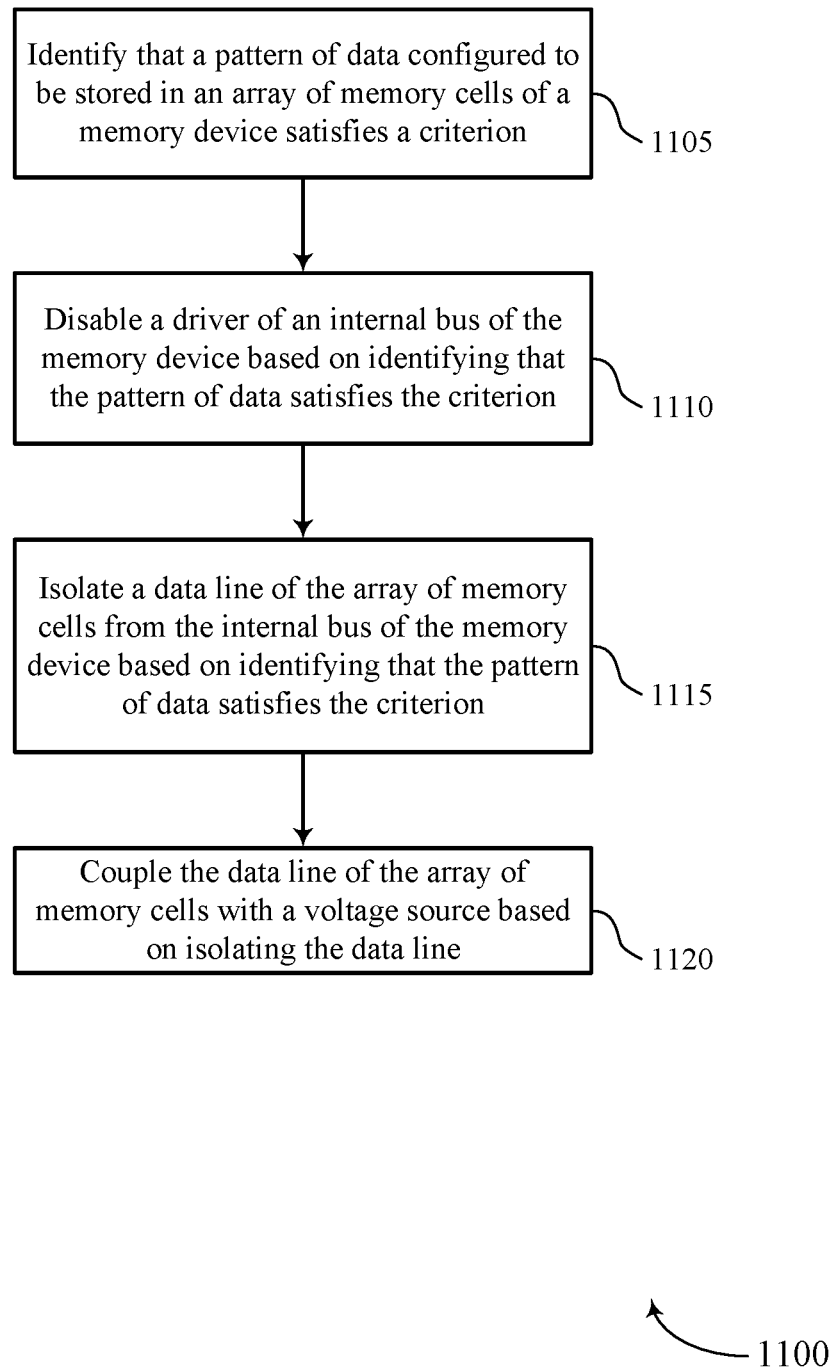
FIGS. 11 through 14 show flowcharts illustrating a method or methods that support low power mode for a memory device in accordance with examples as disclosed herein.

FIG. 11 shows a flowchart illustrating a method or methods 1100 that supports low power mode for a memory device in accordance with aspects of the present disclosure. The operations of method 1100 may be implemented by a memory device or its components as described herein. For example, the operations of method 1100 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1105, the memory device may identify that a pattern of data configured to be stored in an array of memory cells of a memory device satisfies a criterion. The operations of 1105 may be performed according to the methods described herein. In some examples, aspects of the operations of 1105 may be performed by a pattern identifier as described with reference to FIG. 9.

At 1110, the memory device may disable a driver of an internal bus of the memory device based on identifying that the pattern of data satisfies the criterion. The operations of 1110 may be performed according to the methods described herein. In some examples, aspects of the operations of 1110 may be performed by an internal bus driver manager as described with reference to FIG. 9.

At 1115, the memory device may isolate a data line of the array of memory cells from the internal bus of the memory device based on identifying that the pattern of data satisfies the criterion. The operations of 1115 may be performed according to the methods described herein. In some examples, aspects of the operations of 1115 may be performed by an internal bus coupler as described with reference to FIG. 9.

At 1120, the memory device may couple the data line of the array of memory cells with a voltage source based on isolating the data line. The operations of 1120 may be performed according to the methods described herein. In some examples, aspects of the operations of 1120 may be performed by a voltage source coupler as described with reference to FIG. 9.

In some examples, an apparatus as described herein may perform a method or methods, such as the method 1100. The apparatus may include features, means, or instructions (e.g., a non-transitory computer-readable medium storing instructions executable by a processor) for identifying that a pattern of data configured to be stored in an array of memory cells of a memory device satisfies a criterion, disabling a driver of an internal bus of the memory device based on identifying that the pattern of data satisfies the criterion, isolating a data line of the array of memory cells from the internal bus of the memory device based on identifying that the pattern of data satisfies the criterion, and coupling the data line of the array of memory cells with a voltage source based on isolating the data line.

Some examples of the method 1100 and the apparatus described herein may further include operations, features, means, or instructions for disabling a signal of a clock tree at the memory device based on identifying that the pattern of data satisfies the criterion.

Some instances of the method 1100 and the apparatus described herein may further include operations, features, means, or instructions for receiving, from a host device, a second set of data corresponding to a second pattern that fails to satisfy the criterion, and enabling the signal of the clock tree at the memory device based on receiving the second set of data different than the data.

Some cases of the method 1100 and the apparatus described herein may further include operations, features, means, or instructions for receiving, from a host device, the data over a channel, and generating an indicator that the pattern of data satisfies the criterion based on identifying the pattern of data. Disabling the driver may be based on generating the indicator.

Some examples of the method 1100 and the apparatus described herein may further include operations, features, means, or instructions for receiving, from a host device, an indicator that data associated with the host device includes the pattern of data that satisfies the criterion, where identifying the pattern of data may be based on receiving the indicator.

Some instances of the method 1100 and the apparatus described herein may further include operations, features, means, or instructions for enabling the driver of the internal bus of the memory device after a quantity of cycles of a clock signal.

Some cases of the method 1100 and the apparatus described herein may further include operations, features, means, or instructions for determining that bits within the data include a same logic value, where identifying that the pattern of data satisfies the criterion may be based on the determining that the bits within the data include the same logic value.

Figure 12:
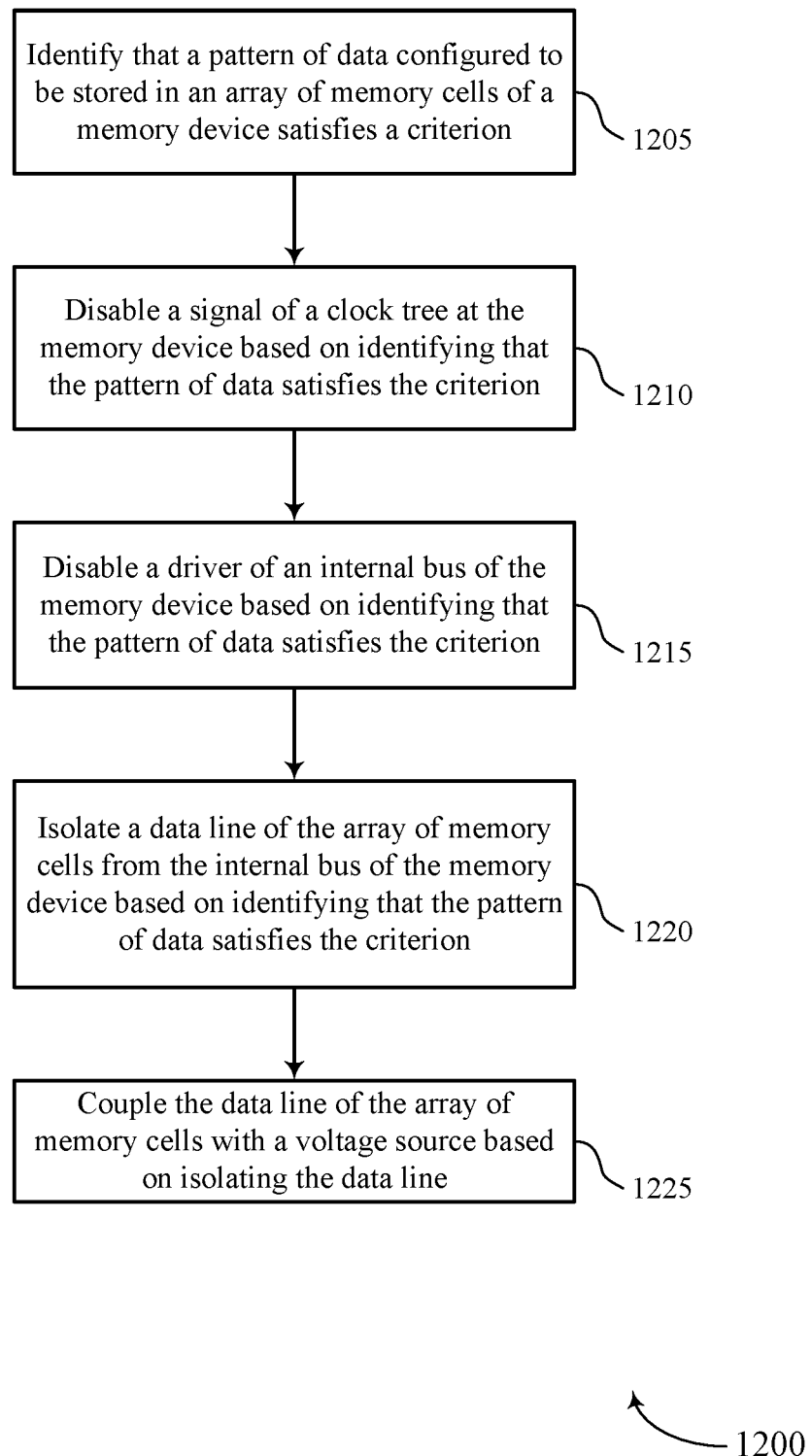

FIG. 12 shows a flowchart illustrating a method or methods 1200 that supports low power mode for a memory device in accordance with aspects of the present disclosure. The operations of method 1200 may be implemented by a memory device or its components as described herein. For example, the operations of method 1200 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1205, the memory device may identify that a pattern of data configured to be stored in an array of memory cells of a memory device satisfies a criterion. The operations of 1205 may be performed according to the methods described herein. In some examples, aspects of the operations of 1205 may be performed by a pattern identifier as described with reference to FIG. 9.

At 1210, the memory device may disable a signal of a clock tree at the memory device based on identifying that the pattern of data satisfies the criterion. The operations of 1210 may be performed according to the methods described herein. In some examples, aspects of the operations of 1210 may be performed by a clock tree manager as described with reference to FIG. 9.

At 1215, the memory device may disable a driver of an internal bus of the memory device based on identifying that the pattern of data satisfies the criterion. The operations of 1215 may be performed according to the methods described herein. In some examples, aspects of the operations of 1215 may be performed by an internal bus driver manager as described with reference to FIG. 9.

At 1220, the memory device may isolate a data line of the array of memory cells from the internal bus of the memory device based on identifying that the pattern of data satisfies the criterion. The operations of 1220 may be performed according to the methods described herein. In some examples, aspects of the operations of 1220 may be performed by an internal bus coupler as described with reference to FIG. 9.

At 1225, the memory device may couple the data line of the array of memory cells with a voltage source based on isolating the data line. The operations of 1225 may be performed according to the methods described herein. In some examples, aspects of the operations of 1225 may be performed by a voltage source coupler as described with reference to FIG. 9.

Figure 13:
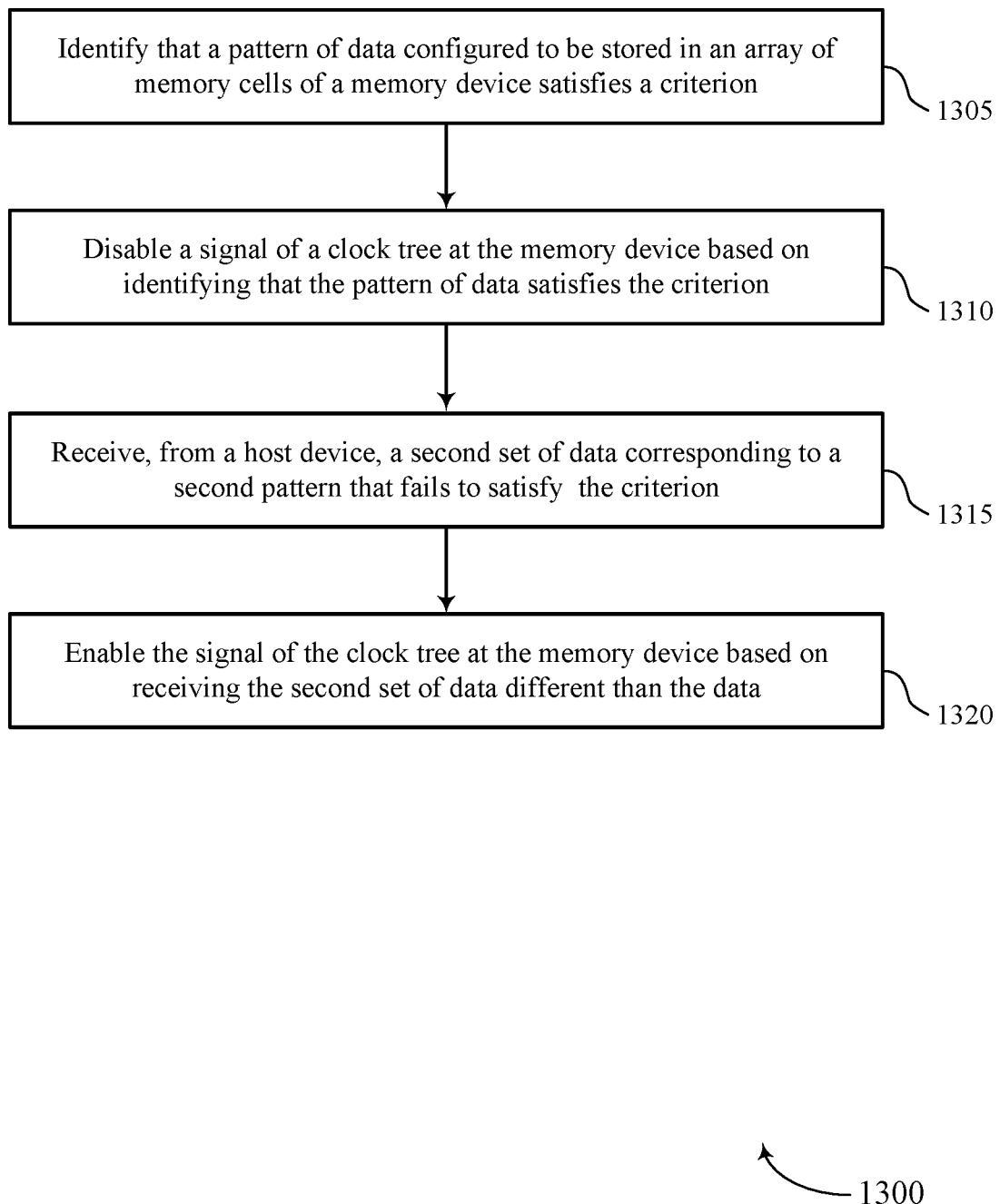

FIG. 13 shows a flowchart illustrating a method or methods 1300 that supports low power mode for a memory device in accordance with aspects of the present disclosure. The operations of method 1300 may be implemented by a memory device or its components as described herein. For example, the operations of method 1300 may be performed by a memory device as described with reference to FIG. 9. In some examples, a memory device may execute a set of instructions to control the functional elements of the memory device to perform the described functions. Additionally or alternatively, a memory device may perform aspects of the described functions using special-purpose hardware.

At 1305, the memory device may identify that a pattern of data configured to be stored in an array of memory cells of a memory device satisfies a criterion. The operations of 1305 may be performed according to the methods described herein. In some examples, aspects of the operations of 1305 may be performed by a pattern identifier as described with reference to FIG. 9.

At 1310, the memory device may disable a signal of a clock tree at the memory device based on identifying that the pattern of data satisfies the criterion. The operations of 1310 may be performed according to the methods described herein. In some examples, aspects of the operations of 1310 may be performed by a clock tree manager as described with reference to FIG. 9.

At 1315, the memory device may receive, from a host device, a second set of data corresponding to a second pattern that fails to satisfy the criterion. The operations of 1315 may be performed according to the methods described herein. In some examples, aspects of the operations of 1315 may be performed by a data receiver as described with reference to FIG. 9.

At 1320, the memory device may enable the signal of the clock tree at the memory device based on receiving the second set of data different than the data. The operations of 1320 may be performed according to the methods described herein. In some examples, aspects of the operations of 1320 may be performed by a clock tree manager as described with reference to FIG. 9.

Figure 14:
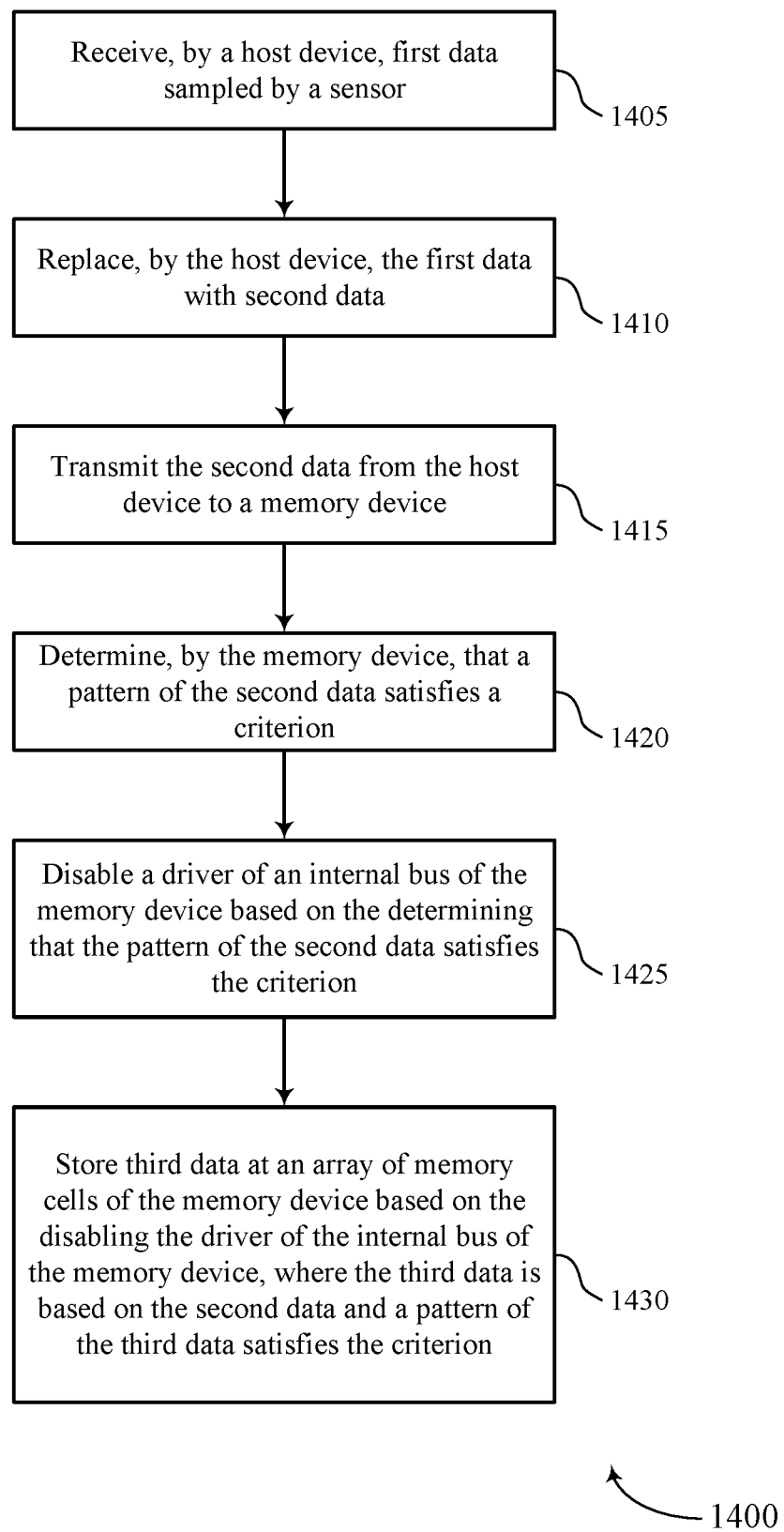

FIG. 14 shows a flowchart illustrating a method or methods 1400 that supports low power mode for a memory device in accordance with aspects of the present disclosure. The operations of method 1400 may be implemented by a system or its components as described herein. For example, the operations of method 1400 may be performed by a system as described with reference to FIG. 10. In some examples, a memory device and host device of a system may execute a set of instructions to control the functional elements of the system to perform the described functions. Additionally or alternatively, a memory device and host device of a system may perform aspects of the described functions using special-purpose hardware.

At 1405, the system may receive, by a host device, first data sampled by a sensor. The operations of 1405 may be performed according to the methods described herein. In some examples, aspects of the operations of 1405 may be performed by a sampled data receiver as described with reference to FIG. 10.

At 1410, the system may replace, by the host device, the first data with second data. The operations of 1410 may be performed according to the methods described herein. In some examples, aspects of the operations of 1410 may be performed by a sampled data manager as described with reference to FIG. 10.

At 1415, the system may transmit the second data from the host device to a memory device. The operations of 1415 may be performed according to the methods described herein. In some examples, aspects of the operations of 1415 may be performed by a transmission manager as described with reference to FIG. 10.

At 1420, the system may determine, by the memory device, that a pattern of the second data satisfies a criterion. The operations of 1420 may be performed according to the methods described herein. In some examples, aspects of the operations of 1420 may be performed by a pattern identifier as described with reference to FIG. 10.

At 1425, the system may disable a driver of an internal bus of the memory device based on the determining that the pattern of the second data satisfies the criterion. The operations of 1425 may be performed according to the methods described herein. In some examples, aspects of the operations of 1425 may be performed by an internal bus driver manager as described with reference to FIG. 10.

At 1430, the system may store third data at an array of memory cells of the memory device based on the disabling the driver of the internal bus of the memory device, where the third data is based on the second data and a pattern of the third data satisfies the criterion. The operations of 1430 may be performed according to the methods described herein. In some examples, aspects of the operations of 1430 may be performed by a data storage manager as described with reference to FIG. 10.

In some examples, one or more apparatuses as described herein may perform a method or methods, such as the method 1400. The apparatus may include features, means, or instructions (e.g., a non-transitory computer-readable medium storing instructions executable by a processor) for receiving, by a host device, first data sampled by a sensor, replacing, by the host device, the first data with second data, and transmitting the second data from the host device to a memory device. The apparatus (or, in some cases, a second apparatus) may include features, means, or instructions for determining, by the memory device, that a pattern of the second data satisfies a criterion, disabling a driver of an internal bus of the memory device based on the determining that the pattern of the second data satisfies the criterion, and storing third data at an array of memory cells of the memory device based on the disabling the driver of the internal bus of the memory device, where the third data is based on the second data and a pattern of the third data satisfies the criterion.

Some examples of the method 1400 and the apparatus described herein may further include operations, features, means, or instructions for determining, by the host device, that the first data may be the same as third data previously sampled by the sensor, where replacing the first data with the second data may be based on the determining.

In some cases of the method 1400, the bits within the second data include a same logic value, where the pattern of the second data satisfies the criterion based on the bits within the second data including the same logic value.

Some instances of the method 1400 and the apparatus (or, in some cases, a second apparatus) described herein may further include operations, features, means, or instructions for isolating, by the memory device, a data line of the array of memory cells from the internal bus of the memory device based on the determining that the pattern of the second data satisfies the criterion, and coupling the data line of the array of memory cells with a voltage source based on isolating the data line, where storing the third data at the array of memory cells may be based on the coupling the data line of the array of memory cells with the voltage source.

Some examples of the method 1400 and the apparatus described herein (or, in some cases, a second apparatus) may further include operations, features, means, or instructions for disabling a signal of a clock tree at the memory device based on the determining that the pattern of the second data satisfies the criterion.

Some examples of the method 1400 and the apparatus described herein may further include operations, features, means, or instructions for transmitting an indicator from the host device to the memory device based on the transmitting the second data, where the indicator indicates that the pattern of the second data satisfies the criterion.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include an array of memory cells that are configured to store data, an internal bus, a data line coupled with the array of memory cells, a voltage source, and a multiplexer coupled with the internal bus, the data line, and the voltage source. The multiplexer may be configured to couple the data line to the internal bus or the voltage source based on whether a pattern of data satisfies a criterion.

Some examples may further include pattern identification logic coupled with the multiplexer and configured to determine whether the pattern of data satisfies the criterion. In some cases, the pattern identification logic may be coupled with an external channel configured to communicate data with a host device. In some instances, the pattern identification logic may be configured to output an indication of whether the pattern of data satisfies the criterion based on comparing a signal received over an external channel to a reference signal.

In some examples, a pattern identification interface is coupled with a host device. The pattern identification may be configured to receive, from the host device, an indication of whether the pattern of data satisfies the criterion. In some cases, a driver is coupled with the internal bus and a host device. The driver may be configured to drive signals over the internal bus based on whether the pattern of data satisfies the criterion. In some instances, the pattern of data satisfies the criterion when bits within the data include a same logic value.

An apparatus is described. The apparatus may include an array of memory cells configured to store data, clocking circuitry configured to generate a set of clock signals associated with operation of the array of memory cells, pattern identification logic configured to output an indication of whether a pattern of data to be stored at the array of memory cells satisfies a criterion, and an enable signal component coupled with the pattern identification logic and configured to output an enable signal to the clocking circuitry based on whether the pattern of data satisfies the criterion.

In some examples, the enable signal component includes a first signal generator configured to output a second enable signal based on receiving an access command, a second signal generator configured to output a third enable signal offset by delay from the second enable signal, and a multiplexer coupled with the first signal generator, the second signal generator, and the pattern identification logic. The multiplexer may be configured to output the enable signal based on the indication of whether the pattern of data satisfies the criterion.

In some cases, the pattern identification logic is configured to determine whether the pattern of data satisfies the criterion, and generate the indication of whether the pattern of data satisfies the criterion based on the determining. In some instances, the pattern identification logic includes a pattern identification interface coupled with a host device and configured to receive the indication of whether the pattern of data satisfies the criterion. In some examples, the indication of whether the pattern of data satisfies the criterion indicates whether the data includes more than a single logic value. In some cases, the clocking circuitry may be configured to enable the set of clock signals based on the enable signal component outputting the enable signal to the clocking circuitry.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving, by a host device, first data sampled by a sensor;
   replacing, by the host device, the first data with second data;
   transmitting the second data from the host device to a memory device;
   determining, by the memory device, that a pattern of the second data satisfies a criterion;
   disabling a driver of an internal bus of the memory device based at least in part on the determining that the pattern of the second data satisfies the criterion; and
   storing third data at an array of memory cells of the memory device based at least in part on the disabling the driver of the internal bus of the memory device, wherein the third data is based at least in part on the second data and a pattern of the third data satisfies the criterion.

2. The method of claim 1, further comprising:
   determining, by the host device, that the first data is the same as the third data previously sampled by the sensor, wherein replacing the first data with the second data is based at least in part on the determining.

3. The method of claim 1, wherein bits within the second data comprise a same logic value, wherein the pattern of the second data satisfies the criterion based at least in part on the bits within the second data comprising the same logic value.

4. The method of claim 1, further comprising:
   isolating, by the memory device, a data line of the array of memory cells from the internal bus of the memory device based at least in part on the determining that the pattern of the second data satisfies the criterion; and
   coupling the data line of the array of memory cells with a voltage source based at least in part on isolating the data line, wherein storing the third data at the array of memory cells is based at least in part on the coupling the data line of the array of memory cells with the voltage source.

5. The method of claim 1, further comprising:
   disabling a signal of a clock tree at the memory device based at least in part on the determining that the pattern of the second data satisfies the criterion.

6. The method of claim 1, further comprising:
   transmitting an indicator from the host device to the memory device based at least in part on the transmitting the second data, wherein the indicator indicates that the pattern of the second data satisfies the criterion.

7. A method, comprising:
   identifying that a pattern of data configured to be stored in an array of memory cells of a memory device satisfies a criterion;
   disabling a driver of an internal bus of the memory device based at least in part on identifying that the pattern of data satisfies the criterion;
   disabling a signal of a clock tree at the memory device based at least in part on identifying that the pattern of data satisfies the criterion;
   isolating a data line of the array of memory cells from the internal bus of the memory device based at least in part on identifying that the pattern of data satisfies the criterion; and
   coupling the data line of the array of memory cells with a voltage source based at least in part on isolating the data line.

8. The method of claim 7, further comprising:
   receiving, from a host device, a second set of data corresponding to a second pattern that fails to satisfy the criterion; and
   enabling the signal of the clock tree at the memory device based at least in part on receiving the second set of data different than the data.

9. The method of claim 7, further comprising:
   receiving, from a host device, the data over a channel; and
   generating an indicator that the pattern of data satisfies the criterion based at least in part on identifying the pattern of data, wherein disabling the driver is based at least in part on generating the indicator.

10. The method of claim 7, further comprising:
    receiving, from a host device, an indicator that data associated with the host device comprises the pattern of data that satisfies the criterion, wherein identifying the pattern of data is based at least in part on receiving the indicator.

11. The method of claim 7, further comprising:
enabling the driver of the internal bus of the memory device after a quantity of cycles of a clock signal.

12. The method of claim 7, further comprising:
determining that bits within the data comprise a same logic value, wherein identifying that the pattern of data satisfies the criterion is based at least in part on the determining that the bits within the data comprise the same logic value.

13. A memory device, comprising:
an array of memory cells that are configured to store data;
an internal bus;
a data line coupled with the array of memory cells;
a voltage source;
a multiplexer coupled with the internal bus, the data line, and the voltage source, wherein the multiplexer is configured to couple the data line to the internal bus or the voltage source based at least in part on whether a pattern of data satisfies a criterion;
a driver coupled with the internal bus and a host device, wherein the driver is configured to drive signals over the internal bus based at least in part on whether the pattern of data satisfies the criterion; and
a clock tree configured to selectively disable a signal based at least in part on whether the pattern of data satisfies the criterion.

14. The memory device of claim 13, further comprising:
pattern identification logic coupled with the multiplexer and configured to determine whether the pattern of data satisfies the criterion.

15. The memory device of claim 14, wherein the pattern identification logic is coupled with an external channel configured to communicate data with the host device.

16. The memory device of claim 14, wherein the pattern identification logic is configured to output an indication of whether the pattern of data satisfies the criterion based at least in part on comparing a signal received over an external channel to a reference signal.

17. The memory device of claim 13, further comprising:
a pattern identification interface coupled with the host device and configured to receive, from the host device, an indication of whether the pattern of data satisfies the criterion.

18. The memory device of claim 13, wherein the pattern of data satisfies the criterion when bits within the data comprise a same logic value.

19. An apparatus, comprising:
an array of memory cells configured to store data;
a clocking circuitry configured to generate a plurality of clock signals associated with operation of the array of memory cells;
a pattern identification logic configured to output an indication of whether a pattern of data to be stored at the array of memory cells satisfies a criterion; and
an enable signal component coupled with the pattern identification logic and configured to output an enable signal to the clocking circuitry based at least in part on whether the pattern of data satisfies the criterion.

20. The apparatus of claim 19, wherein the enable signal component further comprises:
a first signal generator configured to output a second enable signal based at least in part on receiving an access command;
a second signal generator configured to output a third enable signal offset by delay from the second enable signal; and
a multiplexer coupled with the first signal generator, the second signal generator, and the pattern identification logic, wherein the multiplexer is configured to output the enable signal based at least in part on the indication of whether the pattern of data satisfies the criterion.

21. The apparatus of claim 19, wherein the pattern identification logic is configured to:
determine whether the pattern of data satisfies the criterion; and
generate the indication of whether the pattern of data satisfies the criterion based at least in part on the determining.

22. The apparatus of claim 19, wherein the pattern identification logic comprises a pattern identification interface coupled with a host device and configured to receive the indication of whether the pattern of data satisfies the criterion.

23. The apparatus of claim 19, wherein the indication of whether the pattern of data satisfies the criterion indicates whether the data comprises more than a single logic value.

24. The apparatus of claim 19, wherein the clocking circuitry is configured to enable the plurality of clock signals based at least in part on the enable signal component outputting the enable signal to the clocking circuitry.

* * * * *